(12) United States Patent
Shiraishi

(10) Patent No.: US 8,699,014 B2
(45) Date of Patent: Apr. 15, 2014

(54) MEASURING MEMBER, SENSOR, MEASURING METHOD, EXPOSURE APPARATUS, EXPOSURE METHOD, AND DEVICE PRODUCING METHOD

(75) Inventor: Masayuki Shiraishi, Kumagaya (JP)

(73) Assignee: Nikon Corporation, Tokyo (JP)

( * ) Notice: Subject to any disclaimer, the term of this patent is extended or adjusted under 35 U.S.C. 154(b) by 498 days.

(21) Appl. No.: 12/591,925

(22) Filed: Dec. 4, 2009

(65) Prior Publication Data

US 2010/0086865 A1 Apr. 8, 2010

Related U.S. Application Data

(63) Continuation of application No. PCT/JP2008/060608, filed on Jun. 10, 2008.

(30) Foreign Application Priority Data

Jun. 11, 2007 (JP) ................. 2007-154020

(51) Int. Cl.
*G01B 9/00* (2006.01)
*G03B 27/52* (2006.01)
*G03B 27/32* (2006.01)
*G03C 5/00* (2006.01)

(52) U.S. Cl.
USPC ............. 356/124; 355/55; 355/77; 430/30

(58) Field of Classification Search
None
See application file for complete search history.

(56) References Cited

U.S. PATENT DOCUMENTS

| | | | | |
|---|---|---|---|---|
| 4,908,656 A | * | 3/1990 | Suwa et al. | 355/53 |
| 5,434,026 A | * | 7/1995 | Takatsu et al. | 430/30 |
| 5,631,731 A | * | 5/1997 | Sogard | 356/121 |
| 5,750,294 A | * | 5/1998 | Hasegawa et al. | 430/22 |
| 5,914,774 A | * | 6/1999 | Ota | 355/55 |
| 5,976,740 A | * | 11/1999 | Ausschnitt et al. | 430/30 |
| 6,011,611 A | * | 1/2000 | Nomura et al. | 355/67 |
| 6,208,407 B1 | | 3/2001 | Loopstra | |
| 6,262,796 B1 | | 7/2001 | Loopstra et al. | |
| 6,312,373 B1 | | 11/2001 | Ichihara | |
| 6,341,007 B1 | | 1/2002 | Nishi et al. | |
| 6,400,441 B1 | | 6/2002 | Nishi et al. | |
| 6,437,858 B1 | | 8/2002 | Kouno et al. | |

(Continued)

FOREIGN PATENT DOCUMENTS

| | | |
|---|---|---|
| JP | A-11-135400 | 5/1999 |
| JP | A-2000-097666 | 4/2000 |
| JP | A-2001-93819 | 4/2001 |
| WO | WO 99/23692 | 5/1999 |

OTHER PUBLICATIONS

Besacier et al.; "Shadowing effect minimization in EUV mask by modeling;" *Proceedings of SPIE*; Aug. 20, 2004; pp. 849-859; vol. 5446; SPIE; Bellingham, Washington, U.S.A.

(Continued)

*Primary Examiner* — Gordon J Stock, Jr.
(74) *Attorney, Agent, or Firm* — Oliff, PLC

(57) ABSTRACT

A measuring member has a first face and a plurality of first marks arranged on the first face. The first marks have respective orientations corresponding to their positions in a first direction.

40 Claims, 15 Drawing Sheets

(56) References Cited

U.S. PATENT DOCUMENTS

| | | | |
|---|---|---|---|
| 6,440,616 B1* | 8/2002 | Izuha et al. ................... 430/5 |
| 6,549,269 B1 | 4/2003 | Nishi et al. |
| 6,590,634 B1 | 7/2003 | Nishi et al. |
| 6,611,316 B2 | 8/2003 | Sewell |
| 6,897,963 B1 | 5/2005 | Taniguchi et al. |
| 7,050,151 B2* | 5/2006 | Miura ......................... 355/53 |
| 7,605,907 B2* | 10/2009 | Cramer et al. ................ 355/77 |
| 7,834,997 B2* | 11/2010 | Nakayama ................ 356/243.1 |
| 7,948,616 B2* | 5/2011 | Miyashita .................... 356/124 |
| 2002/0041377 A1 | 4/2002 | Hagiwara et al. |
| 2002/0155356 A1* | 10/2002 | Fujimoto ......................... 430/5 |
| 2006/0055915 A1* | 3/2006 | Shiode ........................ 356/124 |
| 2007/0097355 A1* | 5/2007 | Shiode ........................ 356/124 |
| 2008/0088812 A1* | 4/2008 | Magnusson ................... 355/55 |
| 2008/0208499 A1* | 8/2008 | Miyashita ..................... 702/82 |
| 2010/0227261 A1* | 9/2010 | Shiraishi ......................... 430/5 |

OTHER PUBLICATIONS

Kamo et al.; "Impact of mask absorber properties on printability in EUV lithography;" *Proceedings of SPIE*; Nov. 16, 2007; pp. 1-12; vol. 6730.

International Search Report mailed on Sep. 16, 2008 in corresponding International Application No. PCT/JP2008/060608.

Dec. 13, 2011 Office Action issued in JP Application No. 2009-519256 (with English translation).

Sep. 16, 2008 Written Opinion issued in Application No. PCT/JP2008/060608 (with English translation).

* cited by examiner

MEASURING MEMBER, SENSOR, MEASURING METHOD, EXPOSURE APPARATUS, EXPOSURE METHOD, AND DEVICE PRODUCING METHOD

CROSS-REFERENCE TO RELATED APPLICATION

This is a Continuation Application of International Application No. PCT/JP2008/060608, filed Jun. 10, 2008, which claims priority to Japanese Patent Application No. 2007-154020 filed on Jun. 11, 2007. The contents of the aforementioned applications are incorporated herein by reference.

BACKGROUND

1. Field of the Invention

The present invention relates to a measuring member used for an exposure apparatus, a sensor, a measuring method, an exposure apparatus, an exposure method, and a device producing method.

2. Description of Related Art

An exposure apparatus used in a photolithographic process includes a projection optical system that projects an image of a mask pattern onto a substrate. In U.S. Patent Application Publication No. 2002/041377, one example of a technique for measuring an aerial image of the projection optical system is disclosed. When the aerial image of the projection optical system is measured, a mark for measurement is arranged on an object plane side of the projection optical system, and a sensor having an aperture formed on a light-shielding film is arranged on an image plane side of the projection optical system.

When exposure light is irradiated to the mark, a projection state of a mark image by the projection optical system may change due to, for example, an irradiation state of the exposure light or a structure of the mark at the time of irradiating the exposure light to the mark. In this case, the aerial image of the projection optical system may not be able to be measured satisfactorily.

A purpose of some aspects of the present invention is to provide a measuring member that can measure the aerial image satisfactorily, a sensor, and a measuring method. Another purpose of the present invention is to provide an exposure apparatus that can measure the aerial image satisfactorily and expose a substrate satisfactorily, an exposure method, and a device producing method which uses the exposure apparatus and the exposure method.

SUMMARY

According to a first aspect of the present invention, a measuring member used for an exposure apparatus is provided, which includes; a first face, and a plurality of first marks arranged on the first face and having orientations corresponding to their positions in a first direction.

According to the first aspect of the present invention, an aerial image can be measured satisfactorily.

According to a second aspect of the present invention, a sensor used for the exposure apparatus is provided, which includes; a light-shielding film having an aperture through which light from a first mark can enter, and a drive that rotates the light-shielding film corresponding to an orientation of the first mark.

According to the second aspect of the present invention, the aerial image can be measured satisfactorily.

According to a third aspect of the present invention, an exposure apparatus that exposes a substrate with the exposure light and includes the measuring member in the first aspect is provided.

According to the third aspect of the present invention, the substrate can be exposed satisfactorily.

According to a fourth aspect of the present invention, an exposure apparatus that exposes a substrate with exposure light and includes the sensor in the second aspect is provided.

According to the fourth aspect of the present invention, the substrate can be exposed satisfactorily.

According to a fifth aspect of the present invention, an exposure apparatus that exposes a substrate with exposure light is provided, which has a projection optical system; a measuring member arranged on an object plane side of the projection optical system and used for measurement of an aerial image of the projection optical system, the measuring member having a first face, and a plurality of first marks arranged on the first face; and an illumination optical system that illuminates the first face with the exposure light in an illumination region long in a first direction, wherein each of the first marks has an orientation corresponding to its position in the first direction in the illumination region.

According to the fifth aspect of the present invention, the substrate can be exposed satisfactorily.

According to a sixth aspect of the present invention, a device producing method is provided, which includes; exposing a substrate by using the exposure apparatus according to any one of the third, the fourth and the fifth embodiments, and developing the exposed substrate.

According to the sixth embodiment of the present invention, devices can be produced by using the exposure apparatus that can expose the substrate satisfactorily.

According to a seventh aspect of the present invention, a measuring method of an aerial image of a projection optical system is provided, wherein the method includes: arranging on an object plane side of the projection optical system, a plurality of first marks with orientations corresponding to their positions in a first direction being different from each other; illuminating the first marks with exposure light from the illumination optical system, the first marks arranged in an illumination region of the illumination optical system; and measuring images of the first marks by an aerial image measuring sensor, the image of the first marks being projected via the projection optical system.

According to the seventh aspect of the present invention, the aerial image can be measured satisfactorily.

According to an eighth aspect of the present invention, an exposure method of exposing a substrate with exposure light is provided, wherein the method includes; measuring an aerial image of a projection optical system by using the measuring method in the seventh aspect, and exposing the substrate with the exposure light emitted from the measured projection optical system.

According to the eighth aspect of the present invention, the substrate can be exposed satisfactorily.

According to a ninth aspect of the present invention, a device producing method is provided, which includes; exposing a substrate by using the exposure method in the eighth aspect and developing the exposed substrate.

According to the ninth aspect of the present invention, devices can be produced by using the exposure method that can expose the substrate satisfactorily.

According to some aspects of the present invention, the aerial image can be measured satisfactorily. Moreover, according to the present invention, the substrate can be exposed satisfactorily and an excellent device can be produced.

DESCRIPTION OF EMBODIMENTS

An embodiment of the present invention will be illustratively explained with reference to accompanying drawings, however, the present invention is not limited thereto. An XYZ orthogonal coordinate system is set, and a positional relation of respective members is explained with reference to the XYZ orthogonal coordinate system. It is assumed here that a predetermined direction in a horizontal plane is an X-axis direction, a direction orthogonal to the X-axis direction in the horizontal plane is a Y-axis direction, and a direction respectively orthogonal to the X-axis direction and the Y-axis direction (that is, vertical direction) is a Z-axis direction. A rotation (tilt) direction around an X-axis, a Y-axis and a Z-axis are respectively assumed as $\theta X$, $\theta Y$ and $\theta Z$ directions.

First Embodiment

Figure 1:
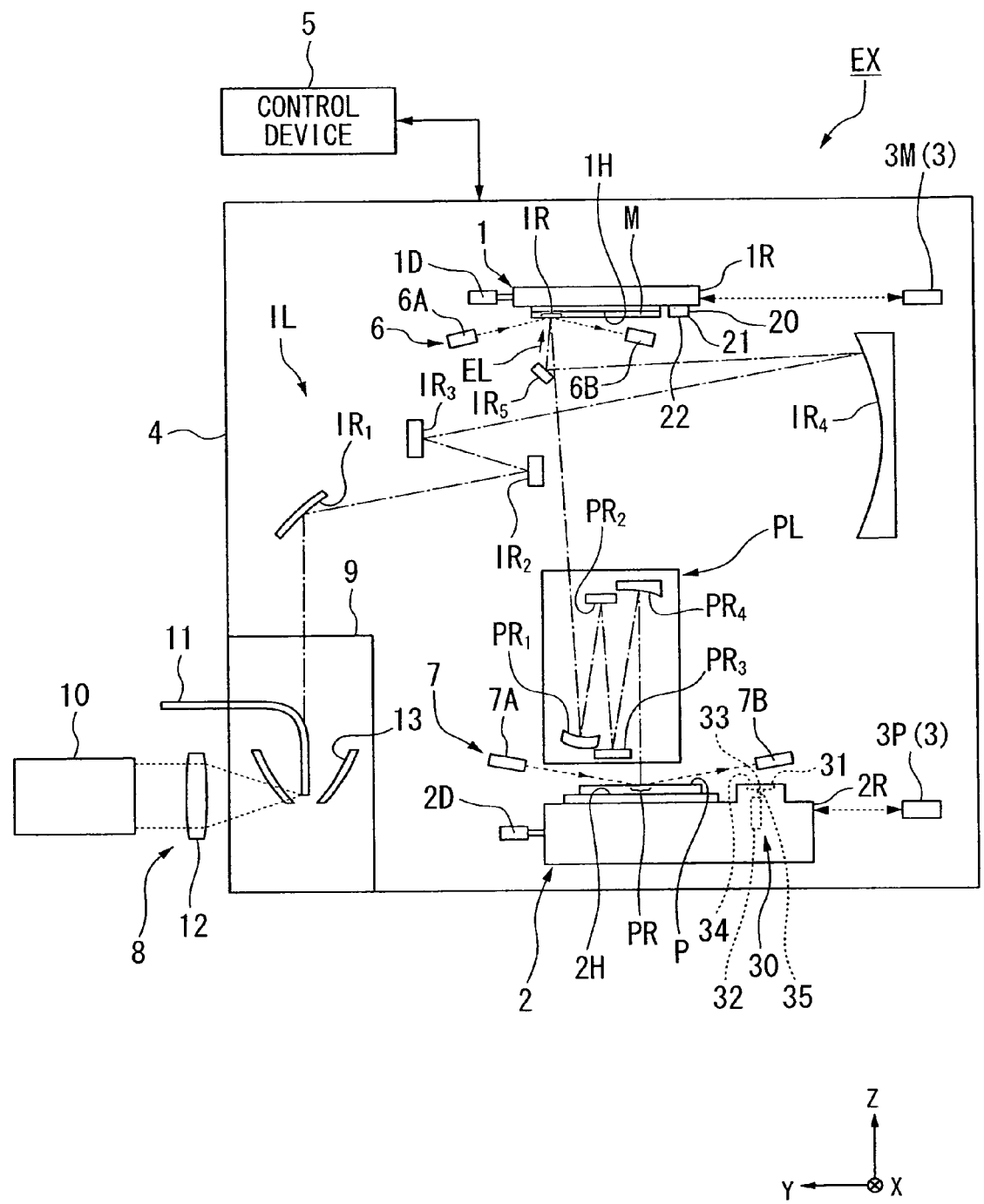
FIG. 1 is a schematic configuration diagram showing one example of an exposure apparatus according to a first embodiment.

A first embodiment will be explained. FIG. 1 is a schematic diagram showing one example of an exposure apparatus EX according to the first embodiment. In FIG. 1, the exposure apparatus EX includes a mask stage 1 movable while holding a mask M on which a pattern is formed, a mask stage 2 movable while holding a substrate P for forming a device, an illumination optical system IL that illuminates the mask M held by the mask stage 1 with exposure light EL, a projection optical system PL that projects an image of a pattern of the mask M illuminated by the exposure light EL onto the substrate P, an interferometer system 3 including laser interferometers 3M and 3P that measure position information of the mask stage 1 and the substrate stage 2, and a control device 5 that controls an operation of the entire exposure apparatus EX.

The exposure apparatus EX in the embodiment is an EUV exposure apparatus that exposes the substrate P using extreme ultraviolet light. The extreme ultraviolet light is an electromagnetic wave in a soft X-ray region, for example, of a wavelength of about 5 to 50 nm. In the explanation below, the extreme ultraviolet light is referred to as EUV light. As one example, in the embodiment, the EUV light having a wavelength of 13.5 nm is used as the exposure light EL.

The exposure apparatus EX includes a chamber unit 4 having a vacuum system that adjusts a predetermined space, through which at least the exposure light EL passes, to a vacuum state (for example, $1.3 \times 10^{-3}$ Pa or below). Accordingly, attenuation of the exposure light (EUV light) EL is suppressed.

The substrate P includes one in which a film such as a photosensitive material (resist) is formed on a base material such as a semiconductor wafer. The mask M includes a reticle on which a device pattern to be projected onto the substrate P is formed. In the embodiment, the mask M is a reflecting mask including a multilayer film capable of reflecting the EUV light. The base material of the mask M is formed of an ultra-low thermal expansion material, and the multilayer film is formed on the base material. The multilayer film includes, for example, an Mo/Si multilayer film and an Mo/Be multilayer film. The pattern is formed by an absorbing film formed on the multilayer film. The absorbing film includes, for example, Cr, Ta and TaN. The exposure apparatus EX illuminates a surface of the mask M (pattern forming surface, reflecting surface), on which the pattern is formed by the multilayer film and the absorbing film, with the exposure light (EUV light) EL, to expose the substrate P with the exposure light reflected by the mask M.

The exposure apparatus EX in the embodiment is a scanning type exposure apparatus (so-called scanning stepper) that projects an image of the pattern of the mask M onto the substrate P while synchronously shifting the mask M and the substrate P in a predetermined scanning direction. At the time of exposing the substrate P, the mask M and the substrate P are shifted in the predetermined scanning direction in an XY plane. In the embodiment, it is assumed that the scanning direction (synchronous movement direction) of the substrate P is a Y-axis direction, and the scanning direction (synchronous movement direction) of the mask M is also the Y-axis direction. The exposure apparatus EX shifts the substrate P in the Y-axis direction with respect to a projection region PR of the projection optical system PL and irradiates the exposure light EL to the mask M while shifting the mask M in the Y-axis direction with respect to an illumination region IR of the illumination optical system IL synchronously with a shift of the substrate P in the Y direction. The exposure light EL via the mask M is irradiated to the substrate P via the projection optical system PL.

The illumination optical system IL includes a plurality of optical elements $IR_1$ to $IR_5$, to illuminate a predetermined illumination region IR on the mask M with the exposure light EL having uniform illumination distribution. The optical elements $IR_1$ to $IR_5$ include a multilayer reflecting mirror including a multilayer film capable of reflecting the EUV light. The multilayer film on the optical elements $IR_1$ to $IR_5$ includes, for example, an Mo/Si multilayer film or an Mo/Be multilayer film. The exposure light EL illuminated by the illumination optical system IL and reflected by the surface of the mask M enters into the projection optical system PL from an object plane side of the projection optical system PL.

The illumination optical system IL illuminates the mask M with the exposure light EL from a light source 8. The light source 8 in the embodiment is a laser excitation plasma light source, and includes a housing 9, a laser device 10 that emits laser beams, and a supply member 11 that supplies a target material such as a xenon gas into the housing 9. The laser beams emitted from the laser device 10 and collected by a light collection optical system 12 is irradiated to the target material emitted from a tip of the supply member 11. The target material irradiated with the laser beams is plasmatized to generate light (exposure light EL) including the EUV light. The light generated at the tip of the supply member 11 is collected by a capacitor 13. The light via the capacitor 13 enters into the optical element $IR_1$ which functions as a collimator mirror arranged outside of the housing 9. The light source can be a discharge plasma light source or other light sources.

The mask stage 1 includes a mask holder 1H that holds the mask M. In the embodiment, the mask holder 1H holds the mask M so that the surface of the mask M faces −Z side and the surface of the mask M and the XY plane are substantially parallel with each other. The mask stage 1 can move in six directions of X-axis, Y-axis, Z-axis, θX, θY, and θZ directions while holding the mask M by the mask holder 1H by a first drive system 1D including an actuator such as a linear motor. The position information of the mask stage (mask M) is measured by a laser interferometer 3M of the interferometer system 3. The laser interferometer 3M measures the position information related to the X-axis, Y-axis, and θZ directions of the mask stage 1 using a measurement mirror 1R provided on the mask stage 1. Surface position information (position information on the Z-axis, θX, and θY) of the surface of the mask M held by the mask stage 1 is detected by a focus/leveling detection system 6. The focus/leveling detection system 6 includes an irradiator 6A that irradiates detection light from a direction oblique to the surface of the mask M and an optical receiver 6B capable of receiving the detection light reflected by the surface of the mask M, and can detect the surface position information of the surface of the mask M. The control device 5 controls the position of the mask M held by the mask stage 1 based on a measurement result of the laser interferometer 3M and a detection result of the focus/leveling detection system 6.

In the embodiment, the illumination optical system IL irradiates the exposure light EL from the direction oblique to the surface of the mask M.

The projection optical system PL includes a plurality of optical elements $PR_1$ to $PR_4$. The projection optical system PL is a reflecting optical system including a plurality of optical elements $PR_1$ to $PR_4$, in which the object (mask) plane is a non-telecentric and an image (wafers) plane is telecentric, and projects the pattern image of the mask M onto the substrate P at predetermined projection magnification. The optical elements $PR_1$ to $PR_4$ include a multilayer reflecting mirror including a multilayer film capable of reflecting the EUV light. The multilayer film of the optical elements $PR_1$ to $PR_4$ includes, for example, the Mo/Si multilayer film or Mo/Be multilayer film. The exposure light EL entering into the projection optical system PL from the object plane side of the projection optical system PL is emitted to the image plane side of the projection optical system PL and enters into the substrate P.

The substrate stage 2 includes a substrate holder 2H that holds the substrate P. In the embodiment, the substrate holder 2H holds the substrate P so that the surface of the substrate P faces +Z side and the surface of the substrate P and the XY plane are substantially parallel with each other. The substrate 2 can move in six directions of X-axis, Y-axis, Z-axis, θX, θY and θZ directions while holding the substrate P by the substrate holder 2H by a second drive system 2D including an actuator such as the linear motor. The position information of the substrate stage 2 (substrate P) is measured by a laser interferometer 3P of the interferometer system 3. The laser interferometer 3P measures the position information related to the X-axis, Y-axis and θZ directions of the substrate stage 2 using a measurement mirror 2R provided on the substrate stage 2. Surface position information (position information on the Z-axis, θX, and θY) of the surface of the substrate P held by the substrate stage 2 is detected by a focus/leveling detection system 7. The focus/leveling detection system 7 includes an irradiator 7A that irradiates detection light from a direction oblique to the surface of the substrate P and an optical receiver 7B capable of receiving the detection light reflected by the surface of the substrate P, and can detect the surface position information of the surface of the substrate P. The control device 5 controls the position of the substrate P held by the substrate stage 2 based on a measurement result of the laser interferometer 3P and a detection result of the focus/leveling detection system 7.

As shown in FIG. 1, the mask M is held by the mask holder 1H on the mask stage 1 and the substrate P is held by the substrate holder 2H on the substrate stage 2 for projecting the pattern image of the mask M onto the substrate P by using the exposure light EL. When the exposure light (EUV light) EL is emitted from the light source 8, the illumination optical system IL reflects the exposure light EL from the light source 8 by the respective optical elements $IR_1$ to $IR_5$ formed of the multilayer reflecting mirror to lead the light to the mask M. The mask M is illuminated with the exposure light EL from the illumination optical system IL. The exposure light EL irradiated to the surface of the mask M and reflected by the surface thereof enters into the projection optical system PL. The projection optical system PL reflects the exposure light EL from the mask M by the respective optical elements $PR_1$ to $PR_4$ formed of the multilayer reflecting mirror to lead the light to the substrate P. The substrate P is exposed with the exposure light EL from the mask M via the projection optical system PL. Accordingly, the pattern image of the mask M is projected onto the substrate P via the projection optical system PL.

The exposure apparatus EX in the embodiment includes a measuring member 20 for measuring an aerial image of the projection optical system PL. The measuring member 20 includes a measurement mark 22 for measuring the aerial image of the projection optical system PL. The measuring member 20 is arranged on the object plane side of the projection optical system PL. In the embodiment, the measuring member 20 is provided on the mask stage 1.

The exposure apparatus EX in the embodiment includes an aerial-image measuring sensor 30 that measures the aerial image of the projection optical system PL as disclosed in, for example, U.S. Patent Application Publication No. 2002/0041377. The aerial-image measuring sensor 30 is arranged on the image plane side of the projection optical system PL. In the embodiment, at least a part of the aerial-image measuring sensor 30 is provided on the substrate stage 2.

Figure 2:
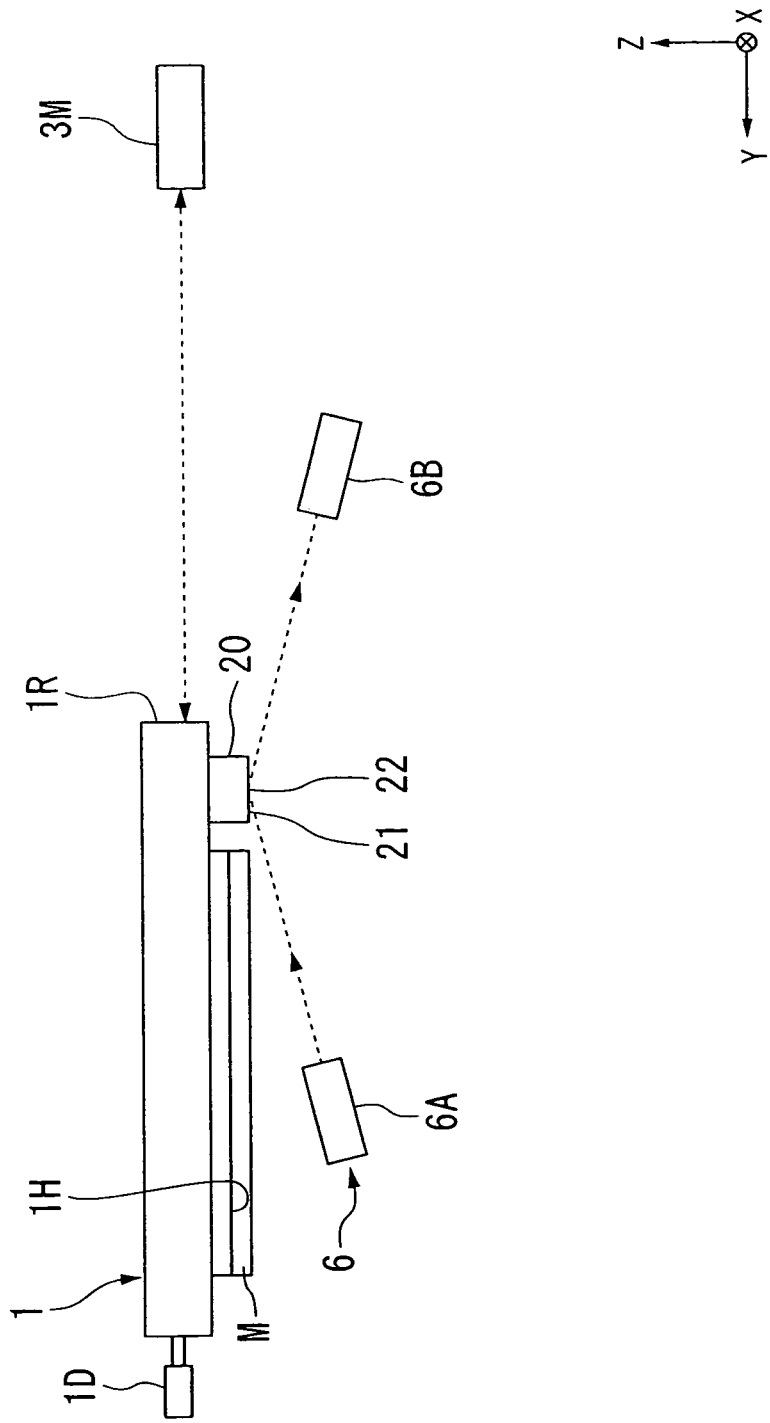
FIG. 2 is a side view showing a vicinity of a mask stage according to the first embodiment.
Figure 3:
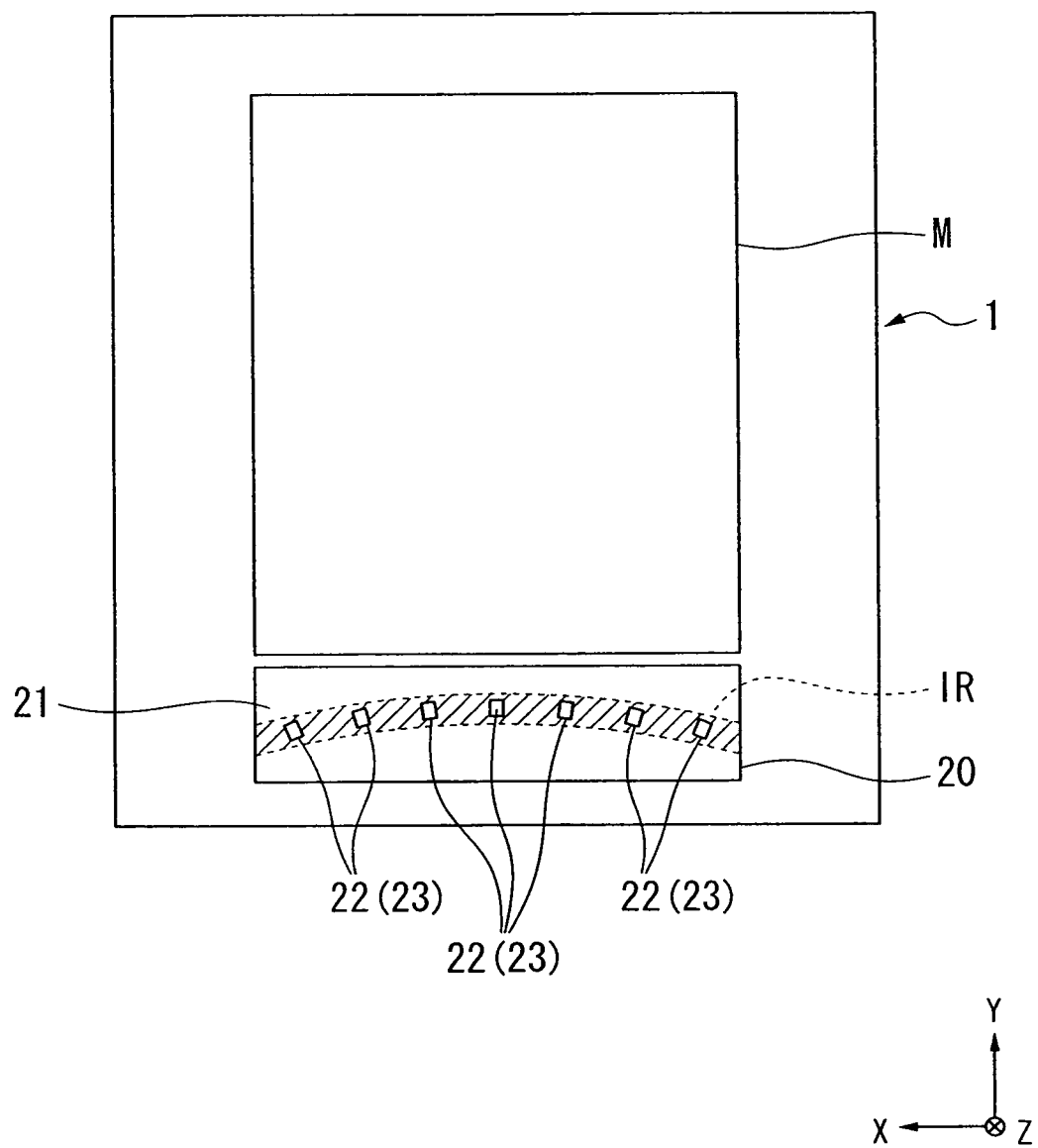
FIG. 3 is a plan view of the mask stage according to the first embodiment as seen from underside.

FIG. 2 is a side view showing a vicinity of the mask stage 1, and FIG. 3 is a plan view of the mask stage 1 as seen from underside (−Z side).

In FIGS. 2 and 3, the measuring member 20 includes a reference plane 21 and a plurality of measurement marks 22 arranged on the reference plane 21 along at least the X-axis direction. The reference plane 21 is a flat surface. The reference plane 21 of the measuring member 20 faces the −Z side, and is arranged substantially parallel with the XY plane. In the embodiment, the surface of the mask M held by the mask holder 1H and the reference plane 21 of the measuring member 21 of the measuring member 20 are arranged substantially in the same plane (XY plane). That is, in the embodiment, the surface of the mask M and the reference plane 21 of the measuring member 20 are substantially flush. The reference plane 21 is used as a reference plane of the exposure apparatus EX.

In the embodiment, the shape of the reference plane 21 in the XY plane is rectangular (oblong) long in the X-axis direction (having a major axis along the X-axis direction). The shape of the illumination region IR of the illumination optical system IL in the XY plane is circular arc long in the X-axis direction. In other word, in the embodiment, the shape of the illumination region IR has a circular-arc extended axis (circular-arc axis), which protrudes in +Y direction. A chord of the circular-arc axis is substantially along the X axis. The length of the chord of the circular-arc axis is larger than the height of the protrusion. In FIG. 3, the illumination region IR is a hatched region. As shown in FIG. 3, the illumination optical system IL illuminates the reference plane 21 with exposure light EL in the illumination region IR long in the X-axis direction.

In the embodiment, the measuring member 20 and the mask M (mask holder 1H) are arranged along the Y-axis direction (scanning direction). The measuring member 20 and the mask M are apposed along the Y axis. The measuring member 20 is arranged on −Y side with respect to the mask holder 1H (mask M). The mask M and the measuring member 20 can be moved to (arranged in) the illumination region IR of the illumination optical system IL by moving the mask stage 1 in the Y-axis direction with respect to the illumination region IR.

The measurement mark 22 is used for measuring the aerial image of the projection optical system PL. The measurement mark 22 is arranged on the reference plane 21 of the measuring member 20. The measurement marks 22 are arranged in a plurality of numbers on the reference plane 21 along at least the X-axis direction. The measurement mark 22 is arranged in a mark forming region 23. The mark forming regions 23 are arranged at seven places on the reference plane 21 along at least the X-axis direction. The seven mark forming regions 23 are away from each other along the X-axis direction.

In the embodiment, the measurement mark 22 is arranged along the longitudinal direction of the circular arc illumination region IR. In other words, the measurement mark 22 is arranged along the circular-arc axis of the illumination region IR. Each of the measurement marks 22 is arranged on the reference plane 21 with a predetermined positional relation so as to be simultaneously arranged inside the illumination region IR. All the measurement marks 22 are arranged in the illumination region IR based on the predetermined positional relation.

Figure 4:
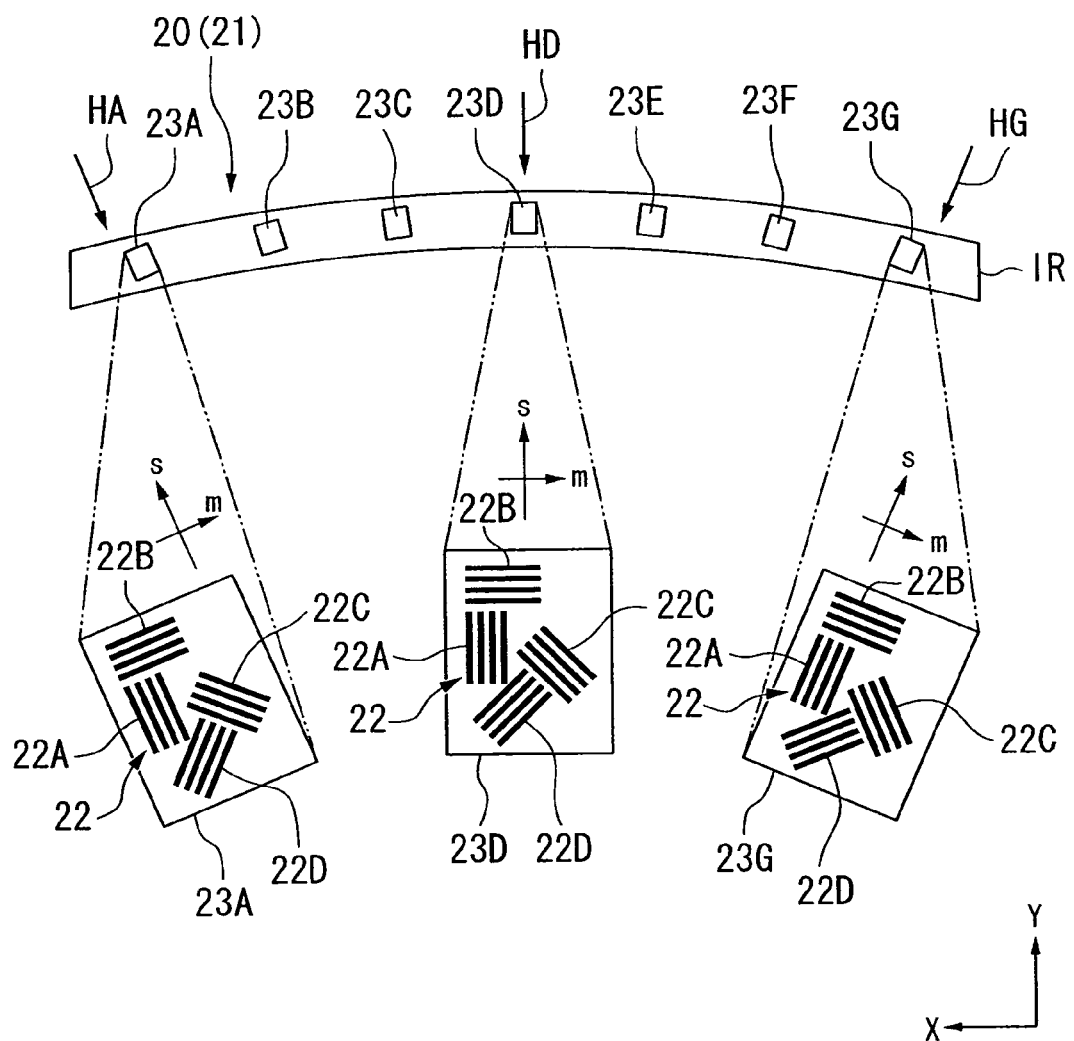
FIG. 4 is a diagram showing a measuring member according to the first embodiment.

FIG. 4 is a diagram showing the measurement marks 22. As shown in FIG. 4, the plurality of measurement marks 22 is respectively arranged in the plurality of mark forming regions 23. In the explanation below, the seven mark forming regions 23 are respectively referred to as first to seventh mark forming regions 23A to 23G.

In FIG. 4, the measurement marks 22 arranged in the first, fourth and seventh mark forming regions 23A, 23D and 23G of the first to seventh mark forming regions 23A to 23G are shown in an enlarged scale as one example.

As shown in FIG. 4, the measurement marks 22 include line and space patterns. In the embodiment, four sets of line and space patterns including four line patterns are arranged in the respective first to seventh mark forming regions 23A to 23G as the measurement marks 22. For example, the measurement mark 22 in the fourth mark forming region 23D includes a first line and space pattern 22A formed by extending in the Y-axis direction and arranged along the X-axis direction, a second line and space pattern 22B formed by extending in the X-axis direction and arranged along the Y-axis direction, a third line and space pattern 22C formed by extending in a direction inclined by about 45 degrees in one direction on the θZ direction with respect to the Y axis and arranged along a direction inclined by about 45 degrees in another direction, and a fourth line and space pattern 22D formed by extending in a direction inclined by about 45 degrees in one direction and arranged along a direction inclined by about 45 degrees in another direction. In the fourth mark forming region 23D, the first line and space pattern 22A includes four line patterns having an extended longitudinal axis along the Y axis and arranged substantially with equal intervals along the X axis. In the fourth mark forming region 23D, the second line and space pattern 22B includes four line patterns having the extended longitudinal axis along the X axis and arranged substantially with equal intervals along the Y axis. In the fourth mark forming region 23D, the third line and space pattern 22C includes four line patterns having the extended longitudinal axis along a first inclined axis inclined by about 45 degrees in one direction (first rotation direction) around the Z axis with respect to the Y axis and arranged substantially with equal intervals along a second inclined axis inclined by about 45 degrees in an opposite direction (second rotation direction) with respect to the Y axis. In the fourth mark forming region 23D, the fourth line and space pattern 22D includes four line patterns having the extended longitudinal axis along the second inclined axis and arranged substantially with equal intervals along the first inclined axis.

The measurement marks 22 in the other mark forming regions 23A to 23C and 23E to 23G have the first to fourth line and space patterns 22A to 22D having the same positional relation as that of the measurement marks 22 in the fourth mark forming region 23D.

As shown in FIG. 4, in the embodiment, the orientation of each measurement mark 22 in the XY plane is respectively different from each other corresponding to its position relative to the X-axis direction. In other words, each of the measurement marks 22 has an orientation corresponding to its position relative to the X-axis direction. In the embodiment, the orientation of each measurement mark 22 in the XY plane is respectively different corresponding to its position relative to the X-axis direction in the illumination region IR.

Figure 5:
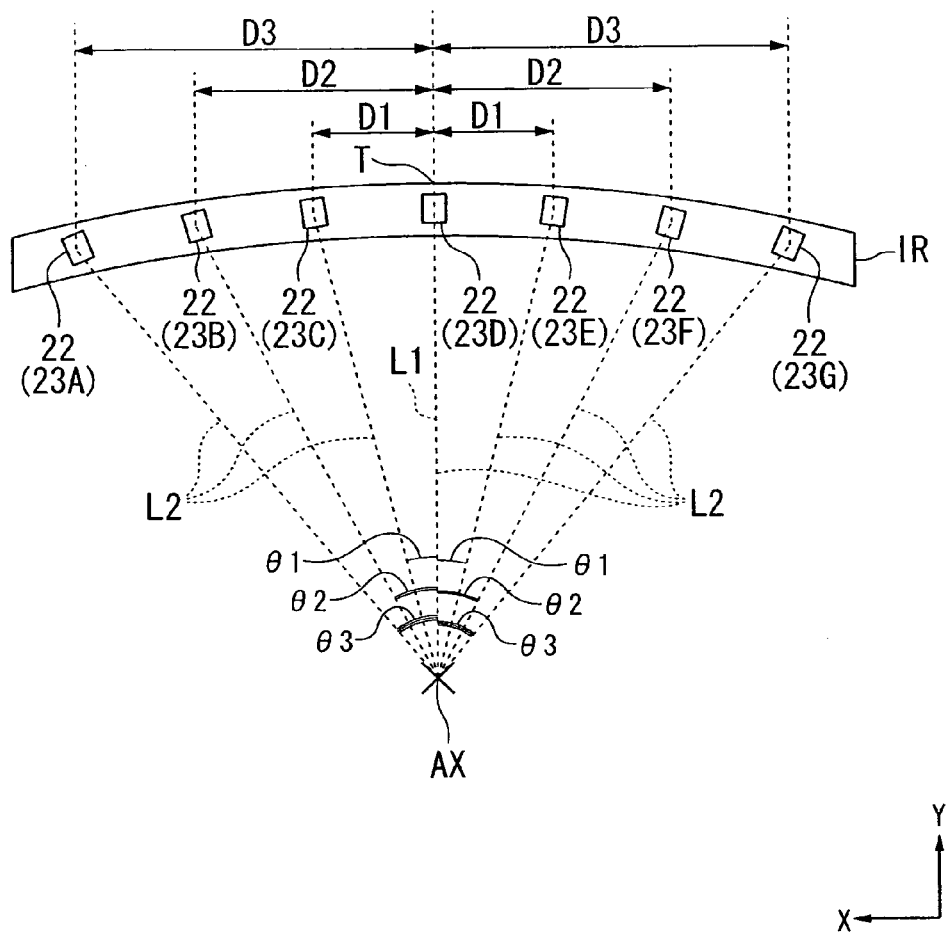
FIG. 5 is a diagram for explaining a positional relation between respective measurement marks.

FIG. 5 is a diagram for explaining a positional relation between respective measurement marks 22. In the embodiment, the orientation of the measurement mark 22 is set corresponding to a distance D1, D2, or D3 from a center T of the illumination region IR relative to the X-axis direction. In the embodiment, the center T of the illumination region IR relative to the X-axis direction and a center of the reference plane 21 substantially match with each other, and the orientation of each measurement mark 22 is set corresponding to the distance D1, D2, or D3 from the center of the reference plane 21 relative to the X-axis direction.

More specifically, in the XY plane, the orientation of each measurement mark 22 (orientation of the entire mark forming regions 23A to 23G) is set corresponding to an angle $\theta 1$, $\theta 2$, or $\theta 3$ formed between a first virtual line L1 connecting an optical axis AX of the projection optical system PL and the center T of the illumination region IR relative to the X-axis direction and a second virtual line L2 connecting the optical axis AX of the projection optical system PL and the measurement mark 22 in the respective mark forming regions 23A to 23G. In other words, an angular position of the third mark forming region 23C with respect to the fourth mark forming region 23D is $\theta 1$ along one direction (first rotation direction) around the Z axis. An angular position of the fifth mark forming region 23E with respect to the fourth mark forming region 23D is $\theta 1$ along an opposite direction (second rotation direction) around the Z axis. Likewise, angular positions of the first, second, sixth and seventh mark forming region 23A, 23B, 23F and 23G with respect to the fourth mark forming region 23D are respectively $\theta 3$ (along the first rotation direction), $\theta 2$ (along the first rotation direction), $\theta 2$ (along the second rotation direction) and $\theta 3$ (along the second rotation direction). In the embodiment, $|\theta 1|<|\theta 2|<|\theta 3|$. The entire third mark forming region 23C has an orientation inclined to the first rotation direction with respect to the orientation of the entire fourth mark forming region 23D. The entire second mark forming region 23B has an orientation more inclined to the first rotation direction than the third mark forming region 23C with respect to the orientation of the entire fourth mark forming region 23D. The entire first mark forming region 23A has an orientation furthermore inclined to the first rotation direction than the third mark forming region 23C with respect to the orientation of the entire fourth mark forming region 23D. The fifth, sixth and seventh mark forming regions 23E, 23F, and 23G respectively have the same orientations relative to the second rotation direction. The line and space patterns 22A, 22B, 22C, and 22D in the mark forming regions 23A to 23C and 23E to 23G have the same positional relation. For example, the respective first line and space patterns 22A in the first, second, and third mark forming regions 23A, 23B, and 23C have the orientation inclined to the first rotation direction with respect to the first line and space pattern 22A in the fourth mark forming region 23D. The inclination (along the first rotation direction) of the first line and space pattern 22A is such that first mark forming region 23A>second mark forming region 23B>third mark forming region 23C.

Figure 6:
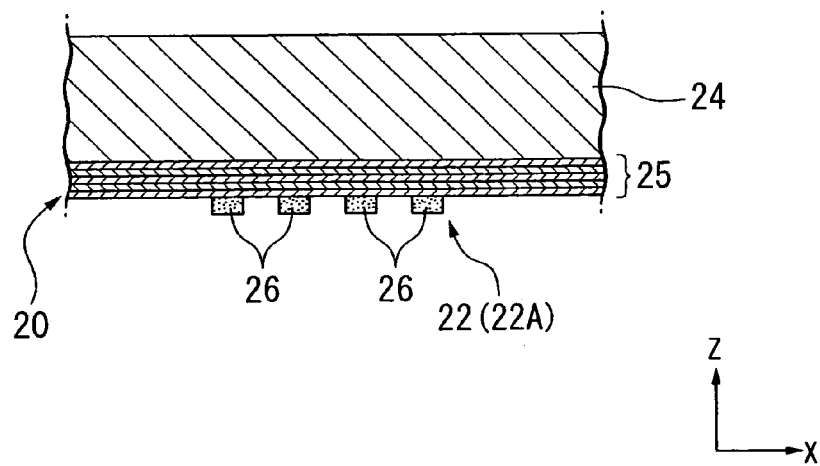
FIG. 6 is a sectional view showing the measuring member according to the first embodiment.

FIG. 6 is a sectional view showing the measuring member 20. In FIG. 6, a sectional view of the first line and space pattern 22A is shown as one example of the measurement mark 22. In FIG. 6, the measuring member 20 includes a base material 24 and a multilayer film 25 formed on the base material 24 and capable of reflecting the EUV light. The base material 24 is formed of an ultra-low thermal expansion material such as an ultra-low thermal expansion glass or an ultra-low thermal expansion ceramic. The multilayer film 25 includes, for example, the Mo/Si multilayer film or the Mo/Be multilayer film. The measurement mark 22 is formed by arranging an absorbing film 26 capable of absorbing the EUV light on the multilayer film 25. The absorbing film 26 can be formed of, for example, Cr, Ta, and TaN. The absorbing film 26 is arranged on the surface (underside) of the multilayer film 25. As shown in FIG. 6, the measurement mark 22 (first line and space pattern 22A) has a relief structure due to the absorbing film 26. The other line and space patterns 22B, 22C and 22D have the same structure as the first line and space pattern 22A.

Figure 7:
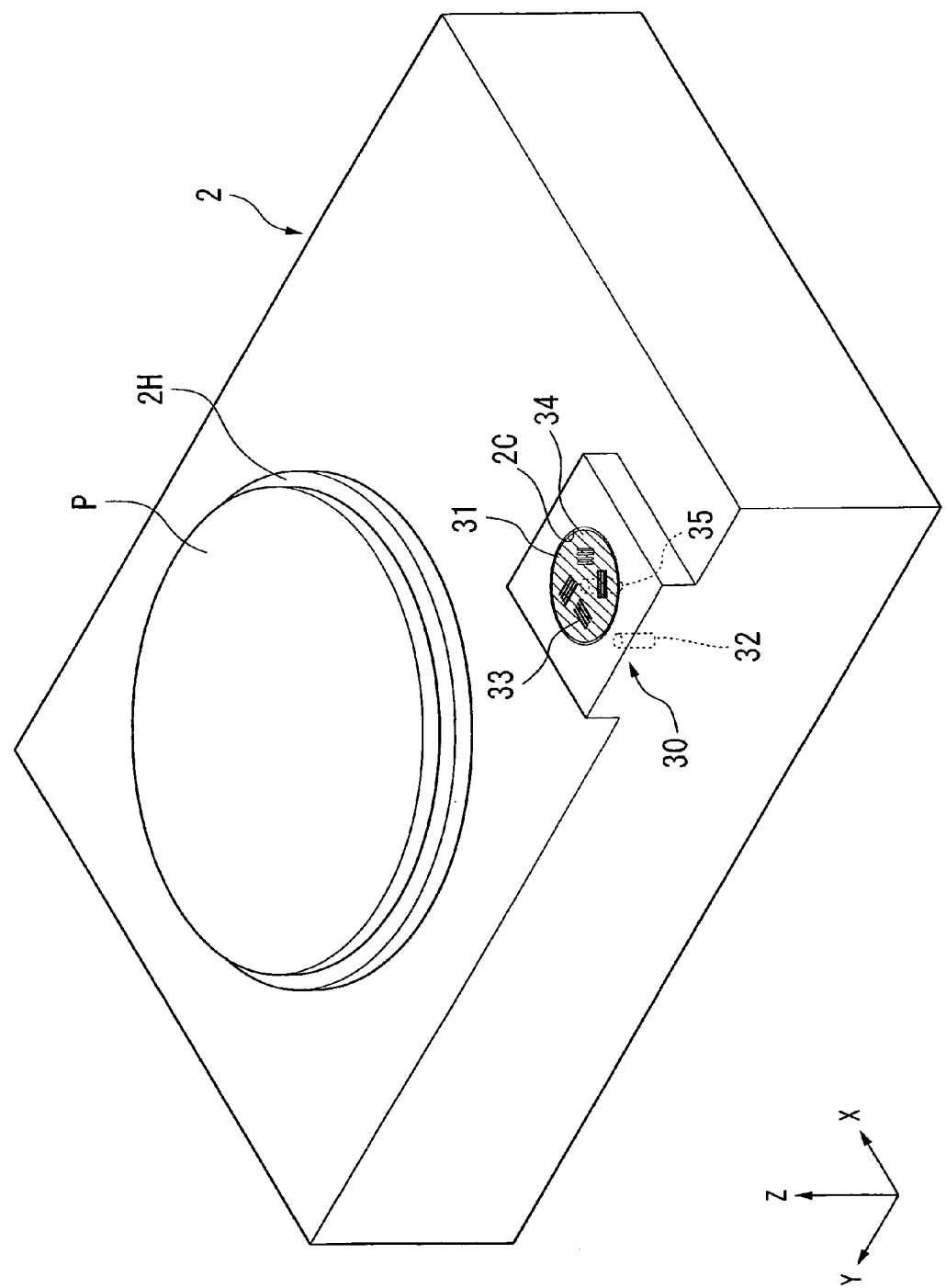
FIG. 7 is a perspective view showing a substrate stage according to the first embodiment.
Figure 8:
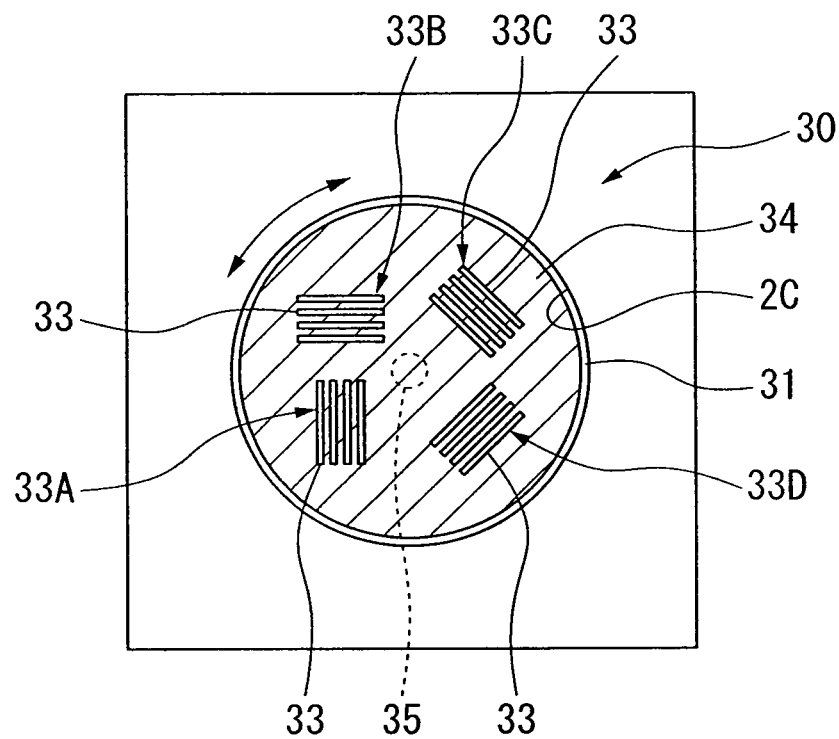
FIG. 8 is a plan view showing a part of an aerial-image measuring sensor according to the first embodiment.
Figure 8:
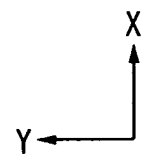

FIG. 7 is a perspective view showing the substrate stage 2 and FIG. 8 is a plan view showing a part of the aerial-image measuring sensor 30. The aerial-image measuring sensor 30 measures the image of the measurement mark 22 projected by the projection optical system PL. The aerial-image measuring sensor 30 includes a slit plate 31 including a light-shielding film 34 having a slit aperture 33, through which the exposure light EL emitted from the projection optical system PL can enter, and an optical receiver 32 that receives the light from the slit plate 31. The optical receiver 32 includes a light-receiving optical system in which the exposure light EL from the slit plate 31 enters, and an optical sensor including a photoelectric transducer that outputs an electric signal corresponding to the light via the light-receiving optical system. The optical sensor (photoelectric transducer) can be formed of a photomultiplier, a photodiode, and an MCP.

The surface of the slit plate 31 on which the light-shielding film 34 is formed is a plane substantially parallel to the XY plane, and is arranged so as to be substantially the same height as that of the surface of the substrate P held by the substrate holder 2H on the substrate stage 2.

The slit plate 31 includes a first line and space pattern 33A arranged with a plurality of (four) slit apertures 33 having a long shape in the X-axis direction in the Y-axis direction, a second line and space pattern 33B arranged with a plurality of (four) slit apertures 33 having a long shape in the Y-axis direction in the X-axis direction, a third line and space pattern 33C having a structure in which, for example, the first line and space pattern 33A is inclined by about 45 degrees in one direction relative to the $\theta Z$ direction with respect to the Y axis, and a fourth line and space pattern 33D having a structure in which the first line and space pattern 33A is inclined by about 45 degrees in the other direction. The first line and space pattern 33A includes four apertures (slits) 33 having an extended longitudinal axis along one direction and arranged substantially with the same intervals along the orthogonal axis with respect to the extended longitudinal axis. The second line and space pattern 33B includes the aperture 33 having the extended longitudinal axis inclined by about 90 degrees with respect to that of the first line and space pattern 33A. The third line and space pattern 33C includes the aperture 33 having the extended longitudinal axis inclined by about 45 degrees in one direction with respect to that of the first line and space pattern 33A. The fourth line and space pattern 33D includes the aperture 33 having the extended longitudinal axis inclined by about 45 degrees in the opposite direction with respect to that of the first line and space pattern 33A.

The aerial-image measuring sensor 30 includes a drive 35 that rotates the slit plate 31 including the aperture 33 and the light-shielding film 34 in the $\theta Z$ direction. The drive 35 is connected to a rear face of the slit plate 31. The slit plate 31 is arranged on an aperture (depression) 2C formed on the substrate stage 2. The aperture 2C has a circular shape in the XY plane, and the slit plate 31 has also the circular shape in the XY plane. Accordingly, the drive 35 can rotate the slit plate 31 satisfactorily.

Figure 9:
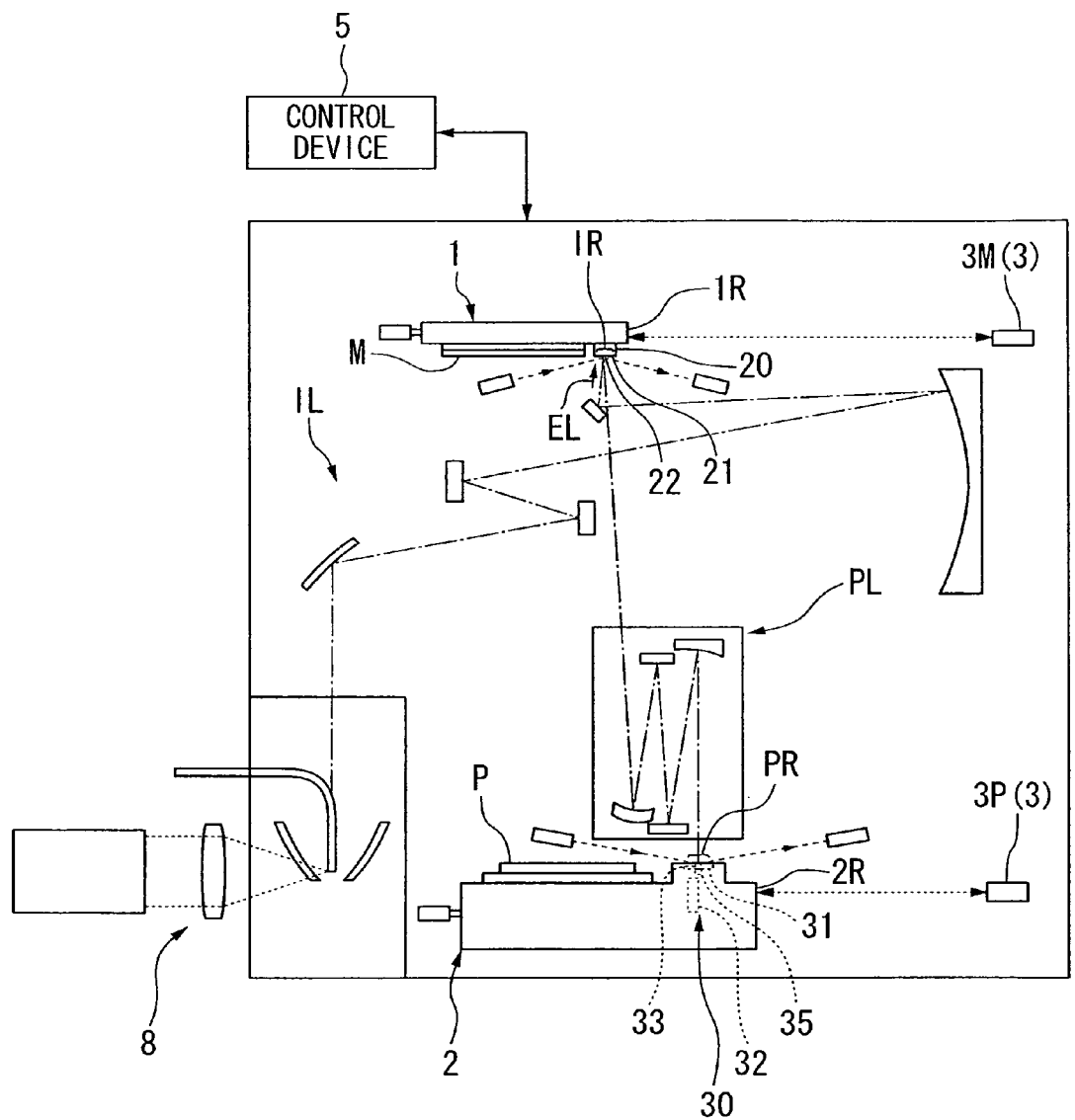
FIG. 9 is a diagram for explaining one example of an operation of the exposure apparatus according to the first embodiment.

One example of an operation of the exposure apparatus EX using the aerial-image measuring sensor 30 will be explained next. FIG. 9 shows one example of a state in which the aerial-image measuring sensor 30 measures an aerial image of the projection optical system PL. To measure the aerial image of the projection optical image PL, the control device 5 performs control such that the measurement marks 22 of the measuring member 20 are arranged in the illumination region IR of the illumination optical system IL, and the apertures 33 in the slit plate 31 are arranged in the projection region PR of the projection optical system PL. In the embodiment, the measuring member 20 is arranged on the mask stage 1, and the control device 5 moves the mask stage 1 so that the measurement marks 22 of the measuring member 20 are arranged at positions to which the exposure light EL emitted from the illumination optical system IL is irradiated. Moreover, the slit plate 31 is arranged on the substrate stage 2, and the control device 5 moves the substrate stage 2 so that the apertures 33 in the slit plate 31 are arranged at positions to which the exposure light EL emitted from the projection optical system PL is irradiated.

The control device 5 performs control so that the illumination optical system IL emits the exposure light EL for measuring the aerial image of the projection optical system PL, to irradiate the exposure light EL to the reference plane 21 of the measuring member 20 in which the measurement marks 22 are arranged. The illumination optical system IL irradiates the exposure light EL from a direction inclined to the reference plane 21. The exposure light EL irradiated to the reference plane 21 of the measuring member 20 including the measurement marks 22 and reflected by the reference plane 21 including the measurement marks 22 enters into the projection optical system PL. The projection optical system PL emits the exposure light EL from the measurement marks 22 toward the slit plate 31. Accordingly, the images of the measurement marks 22 are projected onto the slit plate 31, and the exposure light EL from each measurement mark 22 enters into each aperture 33 in the slit plate 31. The aerial-image measuring sensor 30 measures the images of the measurement marks 22 projected from the projection optical system PL.

In the embodiment, the illumination optical system IL irradiates the exposure light EL from the direction inclined to the reference plane 21. In the embodiment, incidence angles of the exposure lights EL with respect to the respective measurement marks 22 in the first to seventh mark forming regions 23A to 23G are respectively different from each other. The incidence angles of the exposure lights EL with respect to the respective measurement marks 22 in the first to seventh mark forming regions 23A to 23G are respectively different from each other with respect to the Y axis, and are respectively different from each other with respect to the XY plane. As one example, an optical path obtained by projecting an optical path of the exposure light EL that enters into the respective measurement marks 22 in the first, fourth and seventh mark forming regions 23A, 23D and 23G on the XY plane is shown by arrows HA, HD and HG in FIG. 4.

In the embodiment, the orientation of each measurement mark 22 is set corresponding to the incidence angle of the exposure light EL with respect to each measurement mark 22 in the first to seventh mark forming regions 23A to 23G. Accordingly, projection states of the measurement marks 22 in the respective first to seventh mark forming regions 23A to 23G can be substantially matched with each other, and the aerial image of the projection optical system PL can be measured satisfactorily.

The incidence angles of the exposure lights EL with respect to the respective measurement marks 22 in the first to seventh mark forming regions 23A to 23G correspond to the distances D1, D2, and D3 from the center of the illumination region IR relative to the X-axis direction or angles θ1, θ2, and θ3 formed by the first virtual line L1 and the second virtual line L2. Accordingly, by setting the orientation of the respective measurement marks 22 in the first to seventh mark forming regions 23A to 23G corresponding to the distances D1, D2, and D3 from the center of the illumination region IR relative to the X-axis direction, more specifically, corresponding to the angles θ1, θ2, and θ3, the orientation of the respective measurement marks 22 in the first to seventh mark forming regions 23A to 23G can be set corresponding to the incidence angle of the exposure light EL with respect to each measurement mark 22.

For example, when it is assumed that a radiation direction is s-direction with respect to the optical axis AX and a direction orthogonal to the s-direction is m-direction, and when the exposure light EL entering into the respective measurement marks 22 in the first to seventh mark forming regions 23A to 23G enters along the s-direction at the respective positions in the first to seventh mark forming regions 23A to 23G, in the embodiment, as shown in FIG. 4, the orientation of each measurement mark 22 is set so that the first line and space pattern 22A of each measurement mark 22 in the respective first to seventh mark forming regions 23A to 23G is arranged along the s-direction.

Because the orientations of the respective measurement marks 22 in the respective first to seventh mark forming regions 23A to 23G are set according to an sm coordinate system based on the s-direction and the m-direction set locally relative to the respective first to seventh mark forming regions 23A to 23G the orientations of the measurement marks 22 can be set corresponding to the incidence angle of the exposure light EL.

Figure 10A:
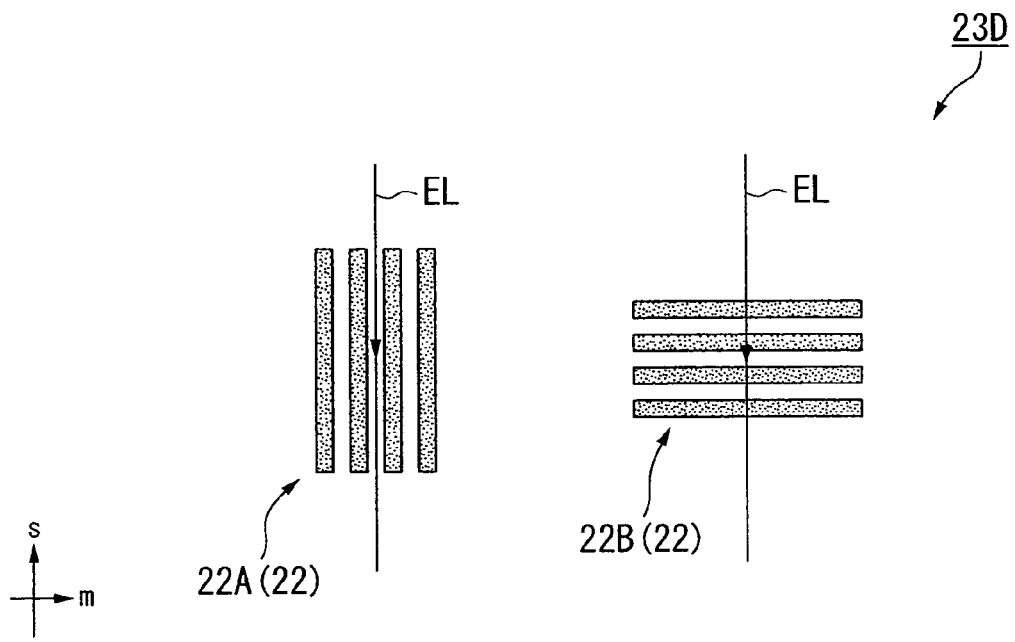
FIG. 10A is a diagram for explaining a relation between the measurement mark and exposure light according to the first embodiment.
Figure 10B:
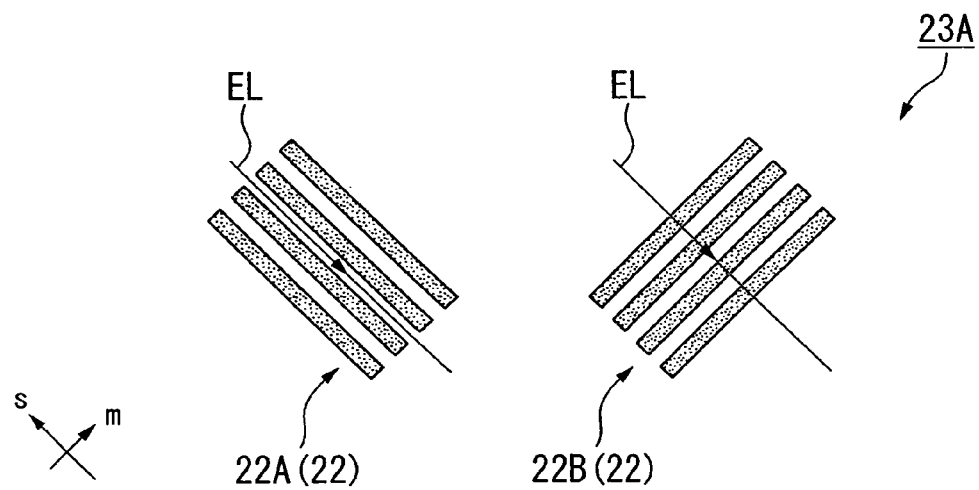
FIG. 10B is a diagram for explaining a relation between the measurement mark and the exposure light according to the first embodiment.

FIGS. 10A and 10B are diagrams for explaining a relation between the measurement marks 22 according to the embodiment and the exposure light EL that enters into the measurement marks 22. FIG. 10A is a diagram showing a relation between the first and second line and space patterns 22A and 22B of the measurement marks 22 in the fourth mark forming region 23D and the exposure light EL that enters into the first and second line and space patterns 22A and 22B, and FIG. 10B is a diagram showing a relation between the first and second line and space patterns 22A and 22B of the measurement marks 22 in the first mark forming region 23A and the exposure light EL that enters into the first and second line and space patterns 22A and 22B.

Each of the first and second line and space patterns 22A and 22B in the fourth mark forming region 23D and each of the first and second line and space patterns 22A and 22B in the first mark forming region 23A face a direction corresponding to the incidence angle of the exposure apparatus EL. In examples shown in FIGS. 10A and 10B, the first line and space pattern 22A in the first and fourth mark forming regions 23A and 23D face a direction along an incident direction of the exposure apparatus EL, and the second line and space pattern 22B in the first and fourth mark forming regions 23A and 23D face a direction orthogonal to the incident direction of the exposure light EL. Accordingly, the positional relation between the first and second line and space patterns 22A and 22B in the fourth mark forming region 23D and the exposure light EL that enters into the first and second line and space patterns 22A and 22B can be made substantially the same as the positional relation between the first and second line and space patterns 22A and 22B in the first mark forming region 23A and the exposure light EL that enters into the first and second line and space patterns 22A and 22B. In other words, the irradiation state of the exposure light EL with respect to the first and second line and space patterns 22A and 22B in the fourth mark forming region 23D can be made substantially the same as the irradiation state of the exposure light EL with respect to the first and second line and space patterns 22A and 22B in the first mark forming region 23A. Accordingly, the projection state of the measurement marks 22 in the first mark forming region 23A and the projection state of the measurement marks 22 in the fourth mark forming region 23D can be substantially matched with each other, and the aerial image of the projection optical system PL can be measured satisfactorily.

Figure 11A:
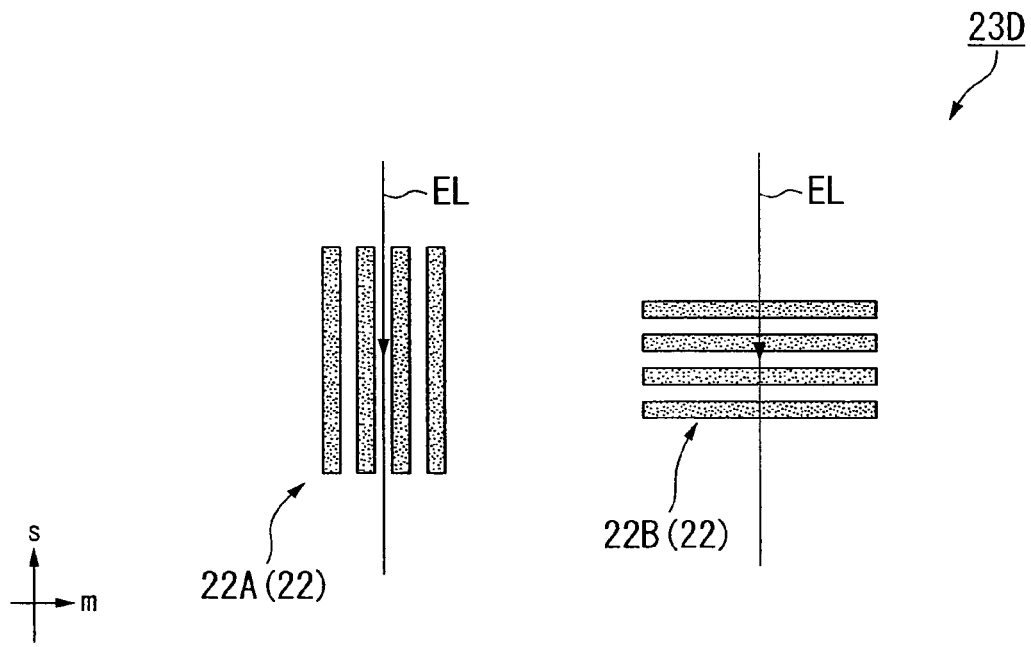
FIG. 11A is a diagram for explaining a relation between the measurement mark and an exposure light according to a comparative example.
Figure 11B:
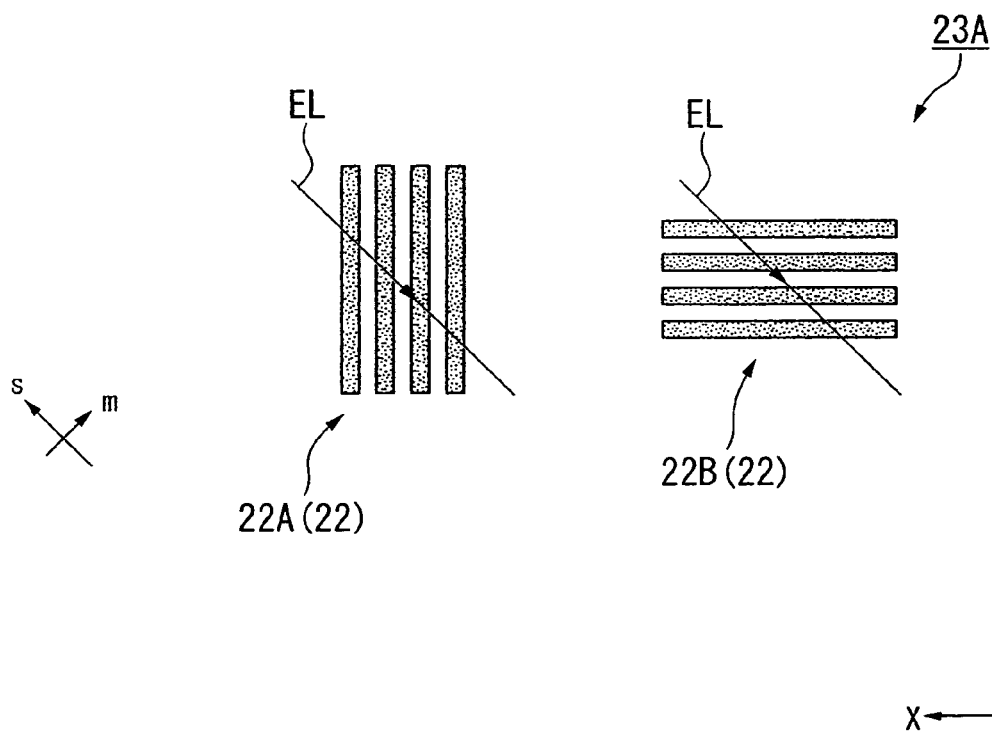
FIG. 11B is a diagram for explaining a relation between the measurement mark and the exposure light according to the comparative example.

FIGS. 11A and 11B are diagrams showing the relation between the measurement marks 22 and the exposure light EL that enters into the measurement marks 22 according to a comparative example. FIG. 11A is a diagram showing the relation between the first and second line and space patterns 22A and 22B of the measurement marks 22 in the fourth mark forming region 23D and the exposure light EL that enters into the first and second line and space patterns 22A and 22B according to the comparative example, and FIG. 11B is a diagram showing the relation between the first and second line and space patterns 22A and 22B of the measurement marks 22 in the first mark forming region 23A and the exposure light EL that enters into the first and second line and space patterns 22A and 22B according to the comparative example.

In FIGS. 11A and 11B, the first and second line and space patterns 22A and 22B in the fourth mark forming region 23D and the first and second line and space patterns 22A and 22B in the first mark forming region 23A face the same direction in an XY coordinate system. In an example shown in FIG. 11A, the first line and space pattern 22A in the fourth mark forming region 23D faces the direction along the incident direction of the exposure light EL, and the second line and space pattern 22B in the fourth mark forming region 23D faces the direction orthogonal to the incident direction of the exposure light EL. On the other hand, in an example shown in FIG. 11B, the first line and space pattern 22A in the first mark forming region 23A faces the direction inclined to the incident direction (s-direction) of the exposure light EL, and the second line and space pattern 22B in the first mark forming region 23A also faces the direction inclined to the incident direction (s-direction) of the exposure light EL. That is, the positional relation between the first and second line and space patterns 22A and 22B in the fourth mark forming region 23D and the exposure light EL that enters into the first and second line and space patterns 22A and 22B is different from the positional relation between the first and second line and space patterns 22A and 22B in the first mark forming region 23A and the exposure light EL that enters into the first and second line and space patterns 22A and 22B. In other words, the irradiation state of the exposure light EL with respect to the first and second line and space patterns 22A and 22B in the fourth mark forming region 23D is different from the irradiation state of the exposure light EL with respect to the first and second line and space patterns 22A and 22B in the first mark forming region 23A.

In the embodiment, because the measurement mark 22 has the relief structure, a shadowed portion may be generated or a generation state of a shadow may change due to a protrusion (the absorbing film 26) of the measurement mark 22, according to the incidence angle (irradiation state) of the exposure light EL entering into the measurement mark 22. For example, in the states in FIGS. 11A and 11B, the generation state of the shadow (a so-called shadowing effect) is different from each other. Then, there is high possibility that a line width of the image of the line and space patterns 22A and 22B in FIG. 11A is different from that of the image of the line and space patterns 22A and 22B in FIG. 11B. As a result, measurement accuracy of the aerial image of the processing optical system PL may decrease such that a measurement result of the aerial image of the projection optical system PL based on the line and space patterns 22A and 22B in FIG. 11A is different from the measurement result of the aerial image of the projection optical system PL based on the image of the line and space patterns 22A and 22B in FIG. 11B.

According to the embodiment, the projection state of the line and space patterns 22A and 22B in FIG. 10A and the projection state of the line and space patterns 22A and 22B in FIG. 10B can be made substantially the same with each other, thereby enabling to control a decrease of the measurement accuracy of the aerial image.

Figure 12A:
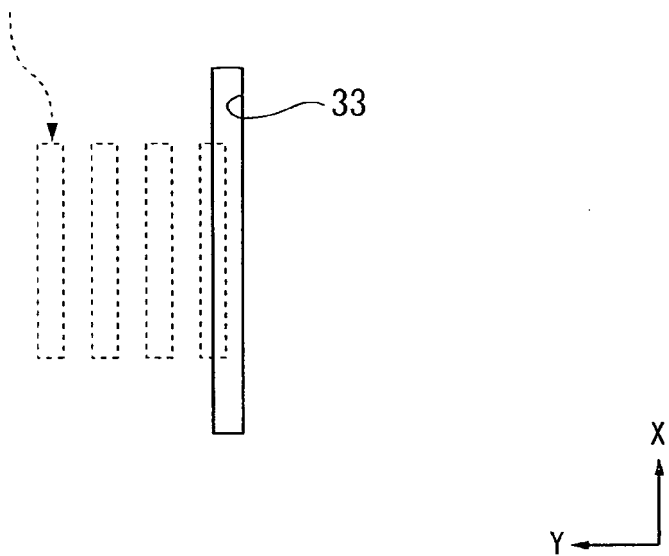
FIG. 12A is a diagram for explaining a relation between an aperture of a light-shielding film and an image of the measurement mark according to the first embodiment.
Figure 12B:
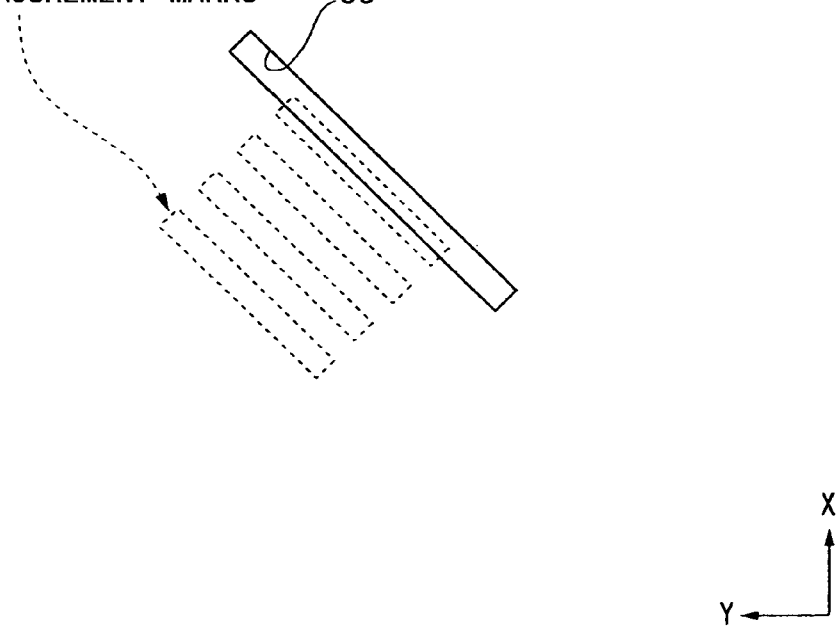
FIG. 12B is a diagram for explaining a relation between the aperture in the light-shielding film and the image of the measurement mark according to the first embodiment.

FIGS. 12A and 12B are diagrams showing a relation between an image of the measurement mark 22 and the aperture 33 in the slit plate 31. In the embodiment, the aerial-image measuring sensor 30 can adjust the orientation of the aperture 33 corresponding to the orientation of the measurement mark 22. That is, the aerial-image measuring sensor 30 can adjust a relation between the image of the measurement mark 22 to be projected and the aperture 33 in the light-shielding film 34. In the embodiment, the drive 35 that rotates the slit plate 31 including the light-shielding film 34 is provided, and the aerial-image measuring sensor 30 rotates the slit plate 31 including the light-shielding film 34 corresponding to the orientation of the measurement mark 22 by using the drive 35.

For example, as shown in FIG. 12A, when the image of the line and space pattern of the measurement mark 22 is long in the X-axis direction, the aerial-image measuring sensor 30 rotates the slit plate 31 so that the longitudinal direction of the aperture 33 for measuring the image of the measurement mark 22 matches with the longitudinal direction of the image of the measurement mark 22. Moreover, as shown in FIG. 12B, when the image of the line and space pattern of the measurement mark 22 is long in the direction inclined to the X-axis direction, the aerial-image measuring sensor 30 rotates the slit plate 31 so that the longitudinal direction of the aperture 33 for measuring the image of the measurement mark 22 matches with the longitudinal direction of the image of the measurement mark 22. Accordingly, the image of the measurement mark 22 can be measured satisfactorily.

The control device 5 calibrates the focus/leveling detection system 7, obtains various aberrations of the projection optical system PL, or calibrate the projection optical system PL as required based on the measurement result of the aerial image of the projection optical system PL measured by using the aerial-image measuring sensor 30 according to the embodiment, for example, as disclosed in U.S. Patent Application Publication No. 2002/0041377. The control device 5 performs control so that the substrate P is exposed with the exposure light EL emitted from the projection optical system PL in which the measurement of the aerial image has been executed.

According to the embodiment, the aerial image of the projection optical image can be measured satisfactorily. Accordingly, calibration processing or the like can be satisfactorily executed by using the measurement result of the aerial image, and a performance decrease of the exposure apparatus EX can be suppressed. As a result, the substrate P can be exposed satisfactorily.

Second Embodiment

A second embodiment is explained next. Like reference signs refer to like or equivalent components in the above-described embodiment, and explanation thereof is simplified or omitted.

Figure 13:
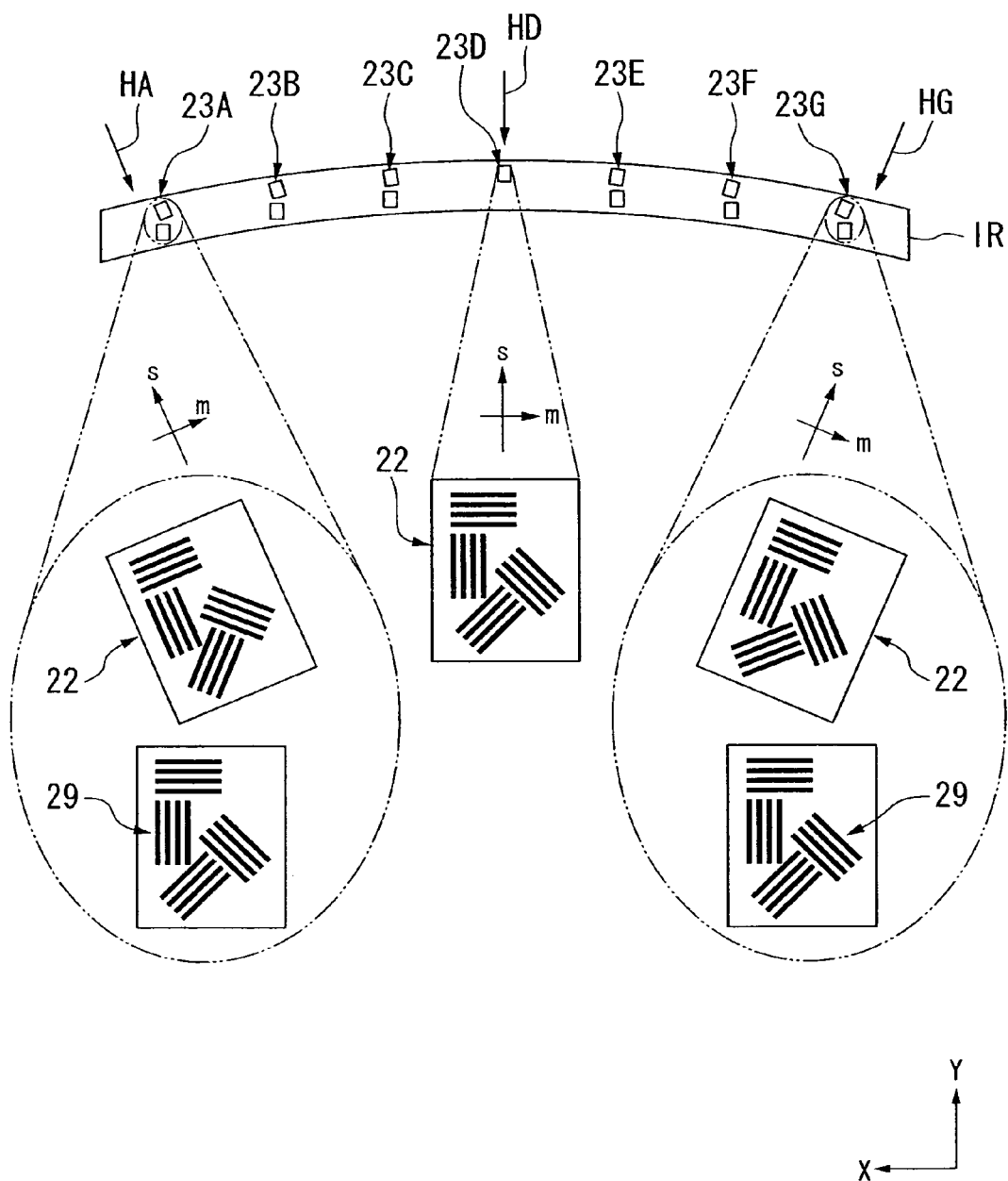
FIG. 13 is a diagram showing a measuring member according to a second embodiment.

FIG. 13 is a plan view showing a measuring member 20B according to the second embodiment. As shown in FIG. 13, a second measurement mark 29 including a line and space pattern long in the X-axis direction and a line and space pattern long in the Y-axis direction can be respectively arranged in the first to seventh mark forming regions 23A to 23G arranged on a reference plane 21 along the X-axis direction, in addition to the measurement mark 22. When a device pattern (circuit pattern) includes a pattern (wiring pattern) long in the X-axis direction and a pattern long in the Y-axis direction, an image of the second measurement mark 29 by a projection optical system PL is measured, thereby enabling to ascertain a state of an image of the wiring pattern by the projection optical system PL.

That is, according to the embodiment, an aberration correlated with an original aberration of the projection optical system PL (aberration after an influence of the shadowing effect is suppressed) can be obtained by measuring the image of the measurement mark 22, and an effective aberration undergone by the device pattern (circuit pattern) (aberration after the influence of the shadowing effect is added) can be obtained by measuring the image of the second measurement mark 29.

Third Embodiment

A third embodiment is explained next. Like reference signs refer to like or equivalent components in the first embodiment, and explanation thereof is simplified or omitted.

Figure 14:
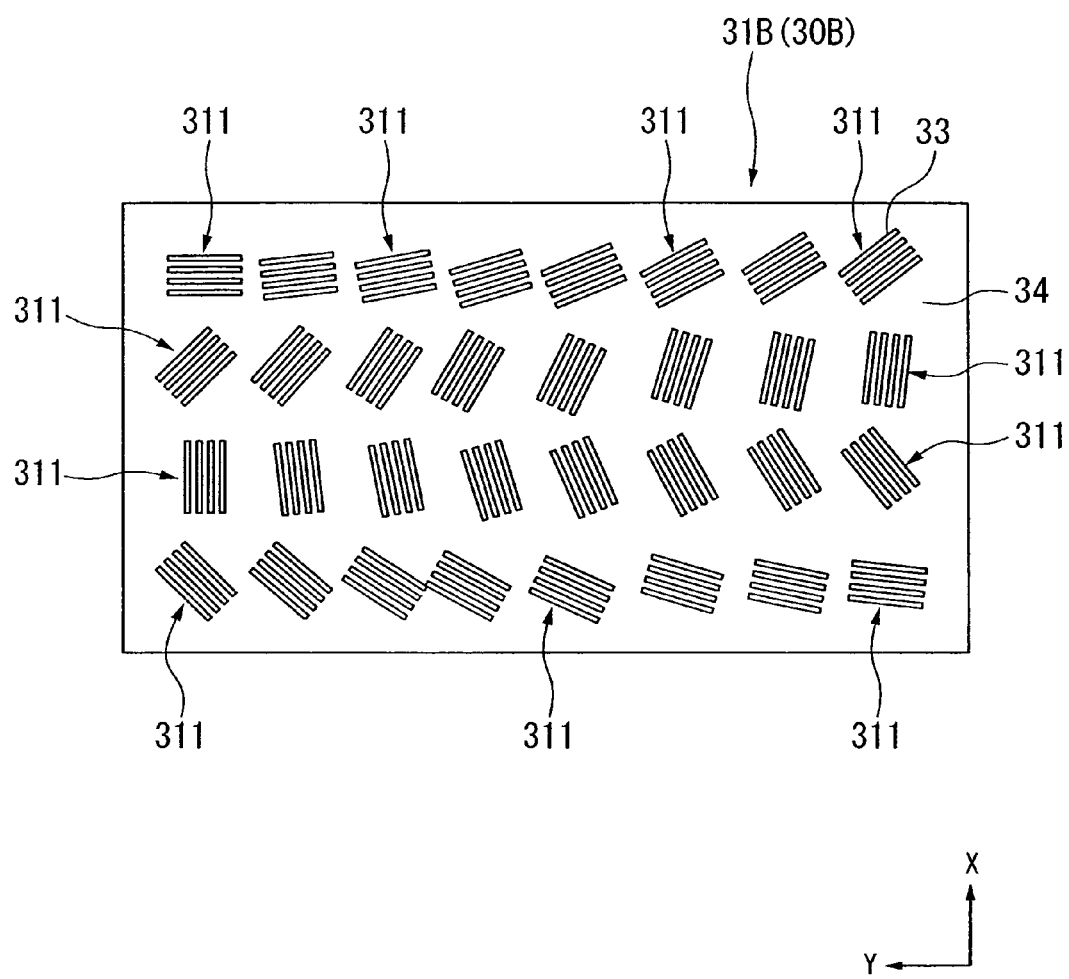
FIG. 14 is a plan view showing a part of an aerial-image measuring sensor according to a third embodiment.

FIG. 14 is a plan view showing a slit plate 31B of an aerial-image measuring sensor 30B according to the third embodiment. As shown in FIG. 14, a slit plate 31B includes a light-shielding film 34 including a plurality of line and space patters 311 in which a plurality of (four) slit apertures 33 having a shape long in a predetermined direction, through which exposure light EL from a measurement marks 22 can enter, in a direction orthogonal to the predetermined direction. The orientations of the line and space patterns 311 in the XY plane are respectively different from each other. The orientations of the line and space patterns 311 are respectively different from each other so as to correspond to the orientations of a plurality of measurement marks 22 in a measuring member 20. A control device 5 selects a line and space pattern 311 long in a direction matched with a longitudinal direction of the image of the measurement mark 22 to be projected, and arranges the selected line and space pattern 311 in a projection region PR of a projection optical system PL. Accordingly, the image of the measurement mark 22 can be measured satisfactorily.

A plurality of optical receivers 32 in an aerial-image measuring sensor 30 can be arranged so as to correspond to the respective line and space patterns 311. Alternatively, one (or predetermined number of) optical receiver 32 is arranged, and can be moved to a position corresponding to the selected line and space pattern 311.

The position of the measurement mark 22 on the reference plane 21 and the orientation of the measurement mark 22 can be adjusted so as to agree with any one orientation of the line and space patterns 311.

Figure 15:
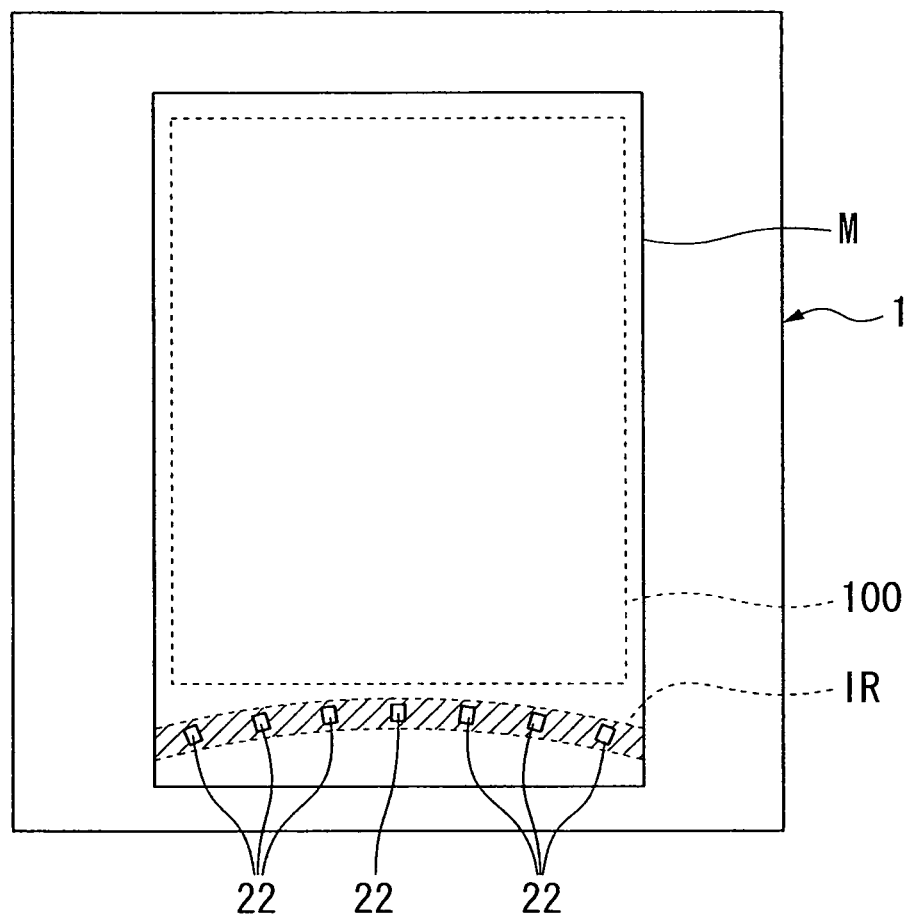
FIG. 15 is a diagram showing one example of a mask.
Figure 15:
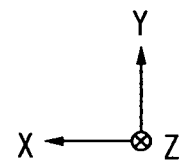

In the above-described respective embodiments, a case that the measurement marks 22 are arranged in the measuring member 20 has been explained as one example, however, as shown in FIG. 15, the measurement marks 22 can be arranged in a predetermined region of a mask M. The mask M shown in FIG. 15 includes a pattern forming region 100 in which a pattern is formed, and measurement marks 22 arranged in the Y-axis direction with respect to the pattern forming region 100.

As the substrate P in the above-described embodiments, not only a semiconductor wafer for manufacturing a semiconductor device but also a glass substrate for a display device, a ceramic wafer for a thin-film magnetic head, or an original plate of a mask or a reticle used for the exposure apparatus (synthetic quartz or silicon wafer) can be applied.

The exposure apparatus EX can be applied to a step-and-repeat type projection exposure apparatus (stepper) in which a pattern of the mask M is collectively exposed in a state with the mask M and the substrate P being stationary and the substrate P is sequentially stepped and moved, as well as a step-and-scan type scanning exposure apparatus (scanning stepper) in which the mask M and the substrate P are synchronously moved to scan and expose the pattern of the mask M.

In the exposure in a step and repeat system, after a reduced image of a first pattern is transferred onto the substrate P by using the projection optical system in a state with the first pattern and the substrate P being substantially stationary, and a reduced image of the second pattern can be superposed partially on the first pattern and collectively exposed on the substrate P in a state with the second pattern and the substrate P being substantially stationary (stitch-type integrated exposure apparatus). The stitch-type exposure apparatus can be applied to the step-and-stitch type exposure apparatus in which at least two patterns are partially superposed on the substrate P and the substrate P is sequentially moved.

As disclosed in, for example, U.S. Pat. No. 6,611,316, the present invention can be applied to the exposure apparatus in which patterns of two masks are synthesized on the substrate via the projection optical system, and one shot region on the substrate is double-exposed substantially simultaneously by one scanning exposure.

The present invention can be applied to a twin-stage exposure apparatus including a plurality of substrate stages as disclosed in U.S. Pat. Nos. 6,341,007, 6,400,441, 6,549,269, 6,590,634, 6,208,407, and 6,262,796.

As disclosed in, for example, Japanese Unexamined Patent Application, First Publication No. H11-135400 (corresponding pamphlet of International Patent Publication No. WO1999-23692), U.S. Pat. No. 6,897,963, and the like, the present invention can be applied to an exposure apparatus that includes a reference member having a substrate stage for holding a substrate and a reference mark formed thereon and/or a measurement stage mounted with various types of photoelectric sensors. The present invention is also applicable to an exposure apparatus that includes a plurality of substrate stages and measurement stages.

The type of the exposure apparatus EX is not limited to the exposure apparatus for manufacturing semiconductor devices that exposes a semiconductor device pattern on the substrate P, and the present invention is widely applicable to an exposure apparatus for manufacturing liquid crystal display devices or displays, an exposure apparatus for manufacturing thin film magnetic heads, image pick-up devices (CCD), micromachines, MEMS, DNA chips, or reticles or masks.

As described above, the exposure apparatus EX in the embodiments is manufactured by assembling various subsystems including the respective components described in the claims so as to maintain predetermined mechanical accuracy, electrical accuracy, and optical accuracy. To ensure these various types of accuracy, adjustment for achieving the optical accuracy for various optical systems, adjustment for achieving the mechanical accuracy for various mechanical systems, and adjustment for achieving the electrical accuracy for various electrical systems are performed before and after the assembly. An assembly process of from the various sub-systems to the exposure apparatus includes electrical connection between the various sub-systems, wiring connection of an electric circuit, and wiring connection of a pneumatic circuit. There is, of course, an assembly process of the respective sub-systems before the assembly process of from the various sub-systems to the exposure apparatus. When the assembly process of from the various sub-systems to the exposure apparatus has finished, overall coordination is performed to ensure the various types of accuracy of the entire exposure apparatus. It is desired that the exposure apparatus is manufactured in a clean room where temperature, degree of cleanness, and the like are controlled.

Figure 16:
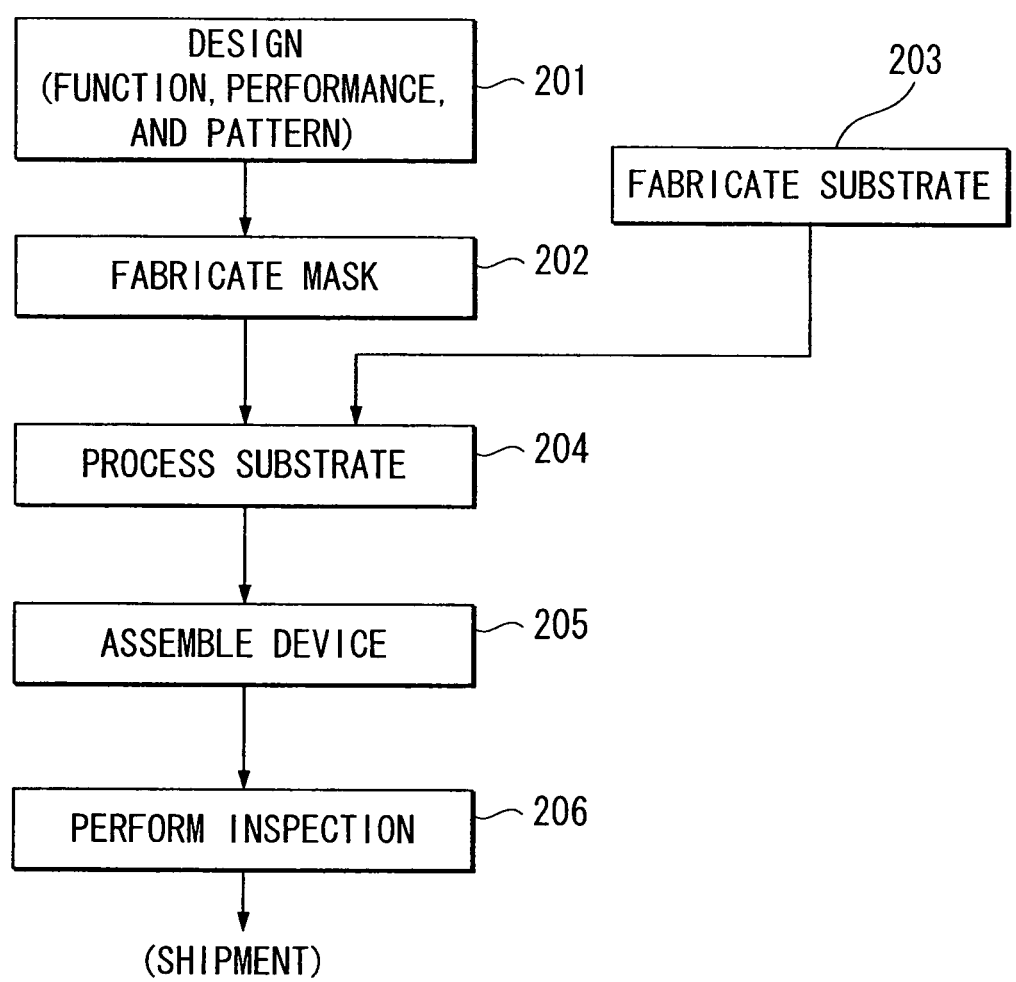
FIG. 16 is a flowchart showing one example of a manufacturing process of a microdevice.

As shown in FIG. 16, a microdevice such as the semiconductor device is manufactured through step 201 for designing functions and performance of the microdevice, step 202 for fabricating a mask (reticle) based on the design step, step 203 for manufacturing the substrate, which is a base member of the device, substrate processing step 204 including exposing the substrate with the exposure light via the mask and developing the exposed substrate according to the above-described embodiments, device assembly step 205 (including processes such as dicing, bonding, and packaging), and inspection step 206.

As far as is permitted, all publications and disclosures of the US patents regarding the exposure apparatus cited in the above-described embodiments and modified examples are incorporated herein as a part of the description of the specification.

The present invention has been explained above, however, according to the present invention, all the components can be appropriately combined or a part of the components may not be used.

What is claimed is:

1. A measuring member used for an exposure apparatus comprising:
   a base material having a first face; and
   a plurality of first patterns formed in a plurality of mark forming regions respectively, the mark forming regions being provided on the base material and arranged at different positions in a first direction on the first face, the first patterns having different orientations determined based on their positions in the first direction.

2. The measuring member according to claim 1, wherein respective orientations of the first patterns are set corresponding to distances of each of the first patterns from a center of the first face in the first direction.

3. The measuring member according to claim 1, wherein each of the first patterns includes a line and space pattern.

4. The measuring member according to claim 1, wherein each of the first patterns includes a relief structure.

5. The measuring member according to claim 1, further comprising:
   second patterns formed in sub mark forming regions on the first face respectively,
   wherein each of the second patterns includes a line and space pattern extending in the first direction and a line and space pattern extending in a second direction orthogonal to the first direction.

6. A sensor used for an exposure apparatus, comprising:
   a light-shielding film having an aperture configured to accept light from the first patterns of the measuring member according to claim 1; and
   a drive that rotates the light-shielding film so that the aperture corresponds to the orientations of the first patterns.

7. The sensor according to claim 6, wherein the aperture includes a slit.

8. An exposure apparatus that exposes a substrate with exposure light, comprising a measuring member according to claim 1.

9. An exposure apparatus that exposes a substrate with exposure light, comprising a sensor according to claim 6.

10. A device producing method comprising:
    exposing a substrate by using the exposure apparatus according to claim 8; and
    developing the exposed substrate.

11. The measuring member according to claim 5, wherein each of the sub mark forming regions is formed in a common region with a corresponding one of the mark forming regions.

12. The measuring member according to claim 1, wherein the first patterns are arranged along a circular-arc axis.

13. The measuring member according to claim 1, wherein a plurality of patterns including one of the first patterns are formed in each of the mark forming regions,
    in each of the mark forming regions, the patterns have different orientations from each other, and
    corresponding patterns of the patterns in respective ones of the mark forming regions have different orientations from each other.

14. The measuring member according to claim 1, wherein the first patterns in respective ones of the mark forming regions have different positions in the first direction from each other and have different positions in a second direction from each other, the second direction being orthogonal to the first direction.

15. A sensor used for an exposure apparatus, comprising:
    a light-shielding film having a plurality of line and space patterns in which a plurality of apertures each having a shape extending in a predetermined direction are arranged in a direction orthogonal to the predetermined direction,
    wherein the apertures are configured to accept light from the first patterns of the measuring member according to claim 1.

16. The measuring member according to claim 2, further comprising:
    second patterns formed in sub mark forming regions on the first face respectively,
    wherein each of the second patterns includes a line and space pattern extending in the first direction and a line and space pattern extending in a second direction orthogonal to the first direction,
    wherein one of the mark forming regions is arranged at the center of the first face in the first direction,
    and wherein one of the first patterns formed in the one of the mark forming regions includes a line and space pattern extending in the first direction and a line and space pattern extending in the second direction.

17. The measuring member according to claim 16,
    wherein respective orientations of the other first patterns, which are formed in the other mark forming regions arranged different from the center of the first face, are set corresponding to distances of each of the first patterns from the center of the first face in the first direction.

18. The sensor according to claim 15, wherein the aperture includes a slit.

19. The sensor according to claim 15, wherein the line and space patterns have different orientations from each other.

20. An exposure apparatus comprising:
a projection optical system via which a substrate is exposed with exposure light; and
a measuring member arranged adjacent an object plane side of the projection optical system and used for measurement of an aerial image of the projection optical system,
wherein the measuring member has:
a base material having a first face; and
a plurality of first patterns formed in a plurality of mark forming regions respectively, the mark forming regions being provided on the base material and arranged at different positions in a first direction on the first face, the first patterns having different orientations determined based on their positions in the first direction.

21. The exposure apparatus according to claim 20, further comprising an illumination optical system that illuminates the first face with the exposure light in an illumination region extending in the first direction, from a direction oblique to the first face.

22. The exposure apparatus according to claim 20, wherein respective incidence angles of the exposure light with respect to the first patterns are different from each other, and
respective orientations of the first patterns are set corresponding to the incidence angles of each of the first patterns.

23. The exposure apparatus according to claim 20, wherein respective orientations of the first patterns are set corresponding to distances of each of the first patterns from a center of an illumination region in the first direction.

24. The exposure apparatus according to claim 20, wherein each of orientations of the first patterns is set corresponding to an angle formed between a first virtual line connecting an optical axis of the projection optical system and a center of an illumination region, and a second virtual line connecting the optical axis of the projection optical system and the first patterns.

25. The exposure apparatus according to claim 20, wherein each of the first patterns includes a line and space pattern.

26. The exposure apparatus according to claim 20, wherein each of the first patterns includes a relief structure.

27. The exposure apparatus according to claim 20, further comprising an aerial image measuring sensor that measures an image of each of the first patterns projected by the projection optical system.

28. The exposure apparatus according to claim 27, wherein the aerial image measuring sensor includes:
a light-shielding film having an aperture through which the exposure light from each of the first patterns can enter, and
a drive that rotates the light-shielding film corresponding to an orientation of each of the first patterns.

29. The exposure apparatus according to claim 27, wherein the aerial image measuring sensor includes:
a light-shielding film having a plurality of apertures through which the exposure light from the first patterns can enter, and
respective orientations of the apertures are made different so as to correspond to the orientations of the first patterns.

30. The exposure apparatus according to claim 28, wherein the aperture includes a slit.

31. The exposure apparatus according to claim 20, further comprising:
second patterns formed in sub mark forming regions on the first face respectively,
wherein each of the second patterns includes a line and space pattern extending in the first direction and a line and space pattern extending in a second direction orthogonal to the first direction.

32. The exposure apparatus according to claim 31, wherein each of the sub mark forming regions is formed in a common region with a corresponding one of the mark forming regions.

33. The exposure apparatus according to claim 23, further comprising:
second patterns formed in sub mark forming regions on the object plane side respectively,
wherein each of the second patterns includes a line and space pattern extending in the first direction and a line and space pattern extending in a second direction orthogonal to the first direction,
wherein one of the mark forming regions is arranged at the center of the illumination region in the first direction,
and wherein one of the first patterns formed in the one of the mark forming regions includes a line and space pattern extending in the first direction and a line and space pattern extending in the second direction.

34. The exposure apparatus according to claim 33,
wherein respective orientations of the other first patterns, which are formed in the other mark forming regions arranged different from the center of the illumination region, are set corresponding to distances of each of the first patterns from the center of the illumination region in the first direction.

35. A measuring method of an aerial image of a projection optical system, the method comprising:
arranging a plurality of first patterns in a plurality of mark forming regions, respectively, adjacent an object plane side of the projection optical system, the mark forming regions being arranged at different positions in a first direction, the first patterns having different orientations determined based on their positions in the first direction; and
measuring images of the first patterns by an aerial image measuring sensor, the images of the first patterns being projected via the projection optical system.

36. The measuring method according to claim 35, further comprising:
illuminating the first patterns with exposure light from an illumination optical system, the first patterns being arranged in an illumination region of the illumination optical system.

37. An exposure method of exposing a substrate with exposure light, the method comprising:
measuring an aerial image of a projection optical system by using the measuring method according to claim 35, and
exposing the substrate with the exposure light emitted from the measured projection optical system.

38. The measuring method according to claim 35, further comprising:
arranging a plurality of second patterns respectively formed in sub mark forming regions on the object plane side of the projection optical system, each of the second patterns including a line and space pattern extending in the first direction and a line and space pattern extending in a second direction orthogonal to the first direction.

39. A device producing method comprising:
exposing a substrate by using the exposure method according to claim 37, and
developing the exposed substrate.

40. The measuring method according to claim 38, wherein each of the sub mark forming regions is formed in a common region with a corresponding one of the mark forming regions.

* * * * *